United States Patent
Hill et al.

(10) Patent No.: US 7,592,276 B2
(45) Date of Patent: Sep. 22, 2009

(54) WOVEN ELECTRONIC TEXTILE, YARN AND ARTICLE

(75) Inventors: Ian Gregory Hill, Hightstown, NJ (US); Seth Trotz, Littleton, MA (US); George Herbert Needham Riddle, Princton, NJ (US); Ponnusamy Palanisamy, Lansdale, PA (US); Joseph M. Carpinelli, Lawrenceville, NJ (US); Dennis L. Matthies, Princeton, NJ (US)

(73) Assignee: Sarnoff Corporation, Princeton, NJ (US)

( * ) Notice: Subject to any disclaimer, the term of this patent is extended or adjusted under 35 U.S.C. 154(b) by 197 days.

(21) Appl. No.: 10/366,441

(22) Filed: Feb. 13, 2003

(65) Prior Publication Data

US 2004/0009729 A1      Jan. 15, 2004

Related U.S. Application Data

(60) Provisional application No. 60/379,723, filed on May 10, 2002, provisional application No. 60/419,159, filed on Oct. 17, 2002.

(51) Int. Cl.
*D03D 15/00* (2006.01)

(52) U.S. Cl. ............... 442/301; 442/205; 442/229; 442/185; 428/913; 428/917; 428/690; 313/511; 362/103

(58) Field of Classification Search .......... 442/2, 442/181, 185, 186, 301, 205–231; 174/36, 174/120 R; 428/100, 901, 690, 917, 913; 2/902, 1; 313/511; 362/103; 40/544; 139/269, 139/273, 319
See application file for complete search history.

(56) References Cited

U.S. PATENT DOCUMENTS

| 3,631,298 | A |   | 12/1971 | Davis |
| 3,818,122 | A | * | 6/1974 | Luetzow ............ 174/86 |
| 4,158,103 | A |   | 6/1979 | Danilin et al. |
| 4,312,913 | A |   | 1/1982 | Rheaume |
| 4,639,545 | A |   | 1/1987 | Pithouse et al. |
| 4,654,748 | A |   | 3/1987 | Rees |

(Continued)

FOREIGN PATENT DOCUMENTS

WO    WO 99/19858    4/1999

(Continued)

OTHER PUBLICATIONS

Maxim Integrated Products, "DS18B20X Flipchip 1-Wire Digital Thermometer", http:/www.maxim-ic.com/quick_view2.cfm?qv_pk=2814, Printed Sep. 9, 2002, 2-Pages.

(Continued)

*Primary Examiner*—D. Lawrence Tarazano
*Assistant Examiner*—Jennifer Steele
(74) *Attorney, Agent, or Firm*—Lowenstein Sandler, PC

(57) ABSTRACT

A woven article comprises a plurality of electrically insulating and/or electrically conductive yarn in the warp and a plurality of electrically insulating and/or electrically conductive yarn in the weft interwoven with the yarn in the warp. A functional yarn in the warp and/or the weft comprises an elongate substrate including at least one electrical conductor and at least one electronic device thereon, wherein the at least one electrical conductor provides directly and/or indirectly an electrical contact for connecting to the electronic device.

12 Claims, 8 Drawing Sheets

U.S. PATENT DOCUMENTS

| | | | |
|---|---|---|---|
| 4,668,545 | A | 5/1987 | Lowe |
| 4,700,054 | A | 10/1987 | Triplett et al. |
| 5,045,706 | A | 9/1991 | Tanaka et al. |
| 5,102,727 | A | 4/1992 | Pittman et al. |
| 5,358,758 | A | 10/1994 | Skelton et al. |
| 5,422,462 | A | 6/1995 | Kishimoto |
| 5,501,133 | A | 3/1996 | Brookstein et al. |
| 5,697,969 | A | 12/1997 | Schmitt et al. |
| 5,767,824 | A | 6/1998 | Jacobsen |
| 5,802,607 | A | 9/1998 | Triplette |
| 5,927,060 | A | 7/1999 | Watson |
| 5,962,967 | A | 10/1999 | Kiryuschev et al. |
| 6,032,450 | A | 3/2000 | Blum |
| 6,045,575 | A | 4/2000 | Rosen et al. |
| 6,072,619 | A | 6/2000 | Kiryuschev et al. |
| 6,145,551 | A | 11/2000 | Jayaraman et al. |
| 6,153,124 | A | 11/2000 | Hung |
| 6,210,771 | B1 * | 4/2001 | Post et al. .................... 428/100 |
| 6,315,009 | B1 | 11/2001 | Jayaraman et al. |
| 6,326,947 | B1 | 12/2001 | Capps |
| 6,370,019 | B1 | 4/2002 | Matthies et al. |
| 6,381,482 | B1 * | 4/2002 | Jayaraman et al. .......... 600/388 |
| 6,432,850 | B1 * | 8/2002 | Takagi et al. ................ 442/190 |
| 6,608,438 | B2 | 8/2003 | Topelberg et al. |
| 2001/0036785 | A1 | 11/2001 | Takagi et al. |
| 2002/0074937 | A1 | 6/2002 | Guberman et al. |
| 2002/0076948 | A1 | 6/2002 | Farrell et al. |
| 2002/0167483 | A1 | 11/2002 | Metcalf |

FOREIGN PATENT DOCUMENTS

| | | |
|---|---|---|
| WO | WO 99/41732 | 8/1999 |
| WO | WO 02/40091 | 5/2002 |

OTHER PUBLICATIONS

Sarnoff Corporation, "Large-Area Ultra-Flexible e-Textile Array Circuits Demonstrated with Color and IR Yarns", Proposal Abstract, Princeton, NJ, Sep. 27, 2001, 10-Pages.

Sarnoff Corporation, "e-Textile Interconnect and Component Attach Technology", vol. 1, Technical/Management Proposal, #2002314, Princeton, NJ, Dec. 4, 2001, 36-Pages.

Sarnoff Corporation, "Textile-based IR and Visible Active Camouflage", Concept Paper, Princeton, NJ, Feb. 7, 2002, 6-Pages.

Air Force Research Laboratory, "Programmable Infrared Marker", Fact Sheet, Kirkland AFB NM, http:/www.de.afrl.af.mil/Factsheets/pirm1.html, Printed May 28, 2002, 1-Page.

Post et al, "E-broidery: Design and fabrication of textile-based computing", IBM Systems Journal, vol. 39, Nos. 3 & 4, 2000, pp. 840-860.

Maxim Integrated Products, "World's First 4-Digit 5×7 Led Driver In A Single Chip!", Sunnyvale, CA, 2002, 1-Page.

Linx Technologies, "LC Series Transmitter Module Data Guide", Revised Dec. 21, 2001, 3-Pages.

Circuit Cellar, http:/www.circuitcellar.com/pastissues/articles/jeff-105/text.html, Printed Jul. 16, 2002, 4-Pages.

Dallas Semiconductor Maxim, "1-Wire Products, Mixed-Signal Design Guide", 2001, 7-Pages.

Dallas Semiconductor, "DS2406 Dual Addressable Switch Plus 1kbit Memory", www.maxim-ic.com, No date listed, 31-Pages.

Glenn Zorpette, "Let There Be Light", IEEE Spectrum, Sep. 2002, pp. 70-74.

Infineon Technologies AG, News—Infineon presents concept for "smart" industrial textiles—far reaching fields of application for electronic integrated into textiles,: http://www.infineon.com/cgi/ecrm.dll/jsp/showfrontend.do?lang-EN&news_nav_oid=997..., May 5, 2003, 7 Pages.

Infineon Technologies AG, "News—Infineon develops chip network for textile—Intelligence by the meter," May 5, 2003, 11 Pages.

International Search Report, Aug. 4, 2003, 4 Pages.

Science, "Electronic Textiles Charged Ahead," vol. 301, Aug. 15, 2003, pp. 909-911.

Darpa, BAA01-41, "Electronic Textiles," (2 Pages), plus Section I (11 Pages) and Section II (4 Pages), 2001.

Thad Starner, "The Challenges Of Wearable Computing: Part 1," IEEE Micro, Georgia Institute Of Technology, pp. 44-52, Jul.-Aug. 2001.

Thad Starner, "The Challenges Of Wearable Computing: Part 2," IEEE Micro, Georgia Institute Of Technology, pp. 54-67, Jul.-Aug. 2001.

Engineering Researchers are Designing the Ultimate Fabrics, Virginia Tech, (Virginia Polytechnic Institute and State University), http://newswise.com/p/articles/view/32667/, Printed Jun. 22, 2004, 2 Pages.

http://www.research.vt.edu/resmag/photo/STRETCH/jpg, Printed Jun. 22, 2004, 1 Page.

Julie A. Soden, "Design and CAD Innovation in Woven Textile Research," Point Art and Design Research Journal, http://www.point.ac.uk./articles/jsoden.htm, Date unknown, Printed Apr. 15, 2003, 12 Pages.

Deborah Chandler, "Lesson 10 Double Weave," *Learning to Weave*, Interweave Press, 1995, 11 Pages.

Author Unknown, "Double Weave with an 8 Shaft Loom," http://www.cs.arizona.edu/patterns/weaving/webdocs/opr_8s.pdf, Date unknown, 13 Pages.

E. Rehmi Post and Maggie Orth, "Smart Fabric, or Washable Computing," Dated 1997, 5 Pages.

Sensatex, Sensatex SmartShirt System, www.sensatex.com/smartshirt, © 2002, Printed Apr. 14, 2003, 4 Pages.

Sensatex, "Sensatex Smart Textiles," www.sensatex.com/textiles, © 2002, 3 Pages.

Kevin Bonsor, "How Computerized Clothing Will Work," HowStuffWorks.com, Printed Apr. 17, 2003, 6 Pages.

International Search Report, May 19, 2005, 2 Pages.

Written Opinion of the International Searching Authority, May 19, 2005, 3 Pages.

Listening Large: E-Textiles for Battlefieled Sound Detection Begin Field Tests This Year, Information Sciences Institute, www.usc.edu/isinews/print/p57.html, Printed Jun. 22, 2004, 3 Pages.

LIGHT-SCIENCE.COM, Engineering researchers are designing the ultimate fabrics, for casual or military wear, www.light-science.com/vtfashion.html, Printed Jun. 22, 2004, 3 Pages.

Engineering Researchers are Designing the Ultimate Fabrics, for Casual or Military Wear, http://www.eurekalert.org/pub releases/2002-11/vt-era110702.php, Printed Jun. 22, 2004, 2 Pages.

Smart Sensor Textiles Under Development, Future Pundit, http://www.futurepundit.com/archives/000595.html, Printed Jun. 22, 2004, 6 Pages.

\* cited by examiner

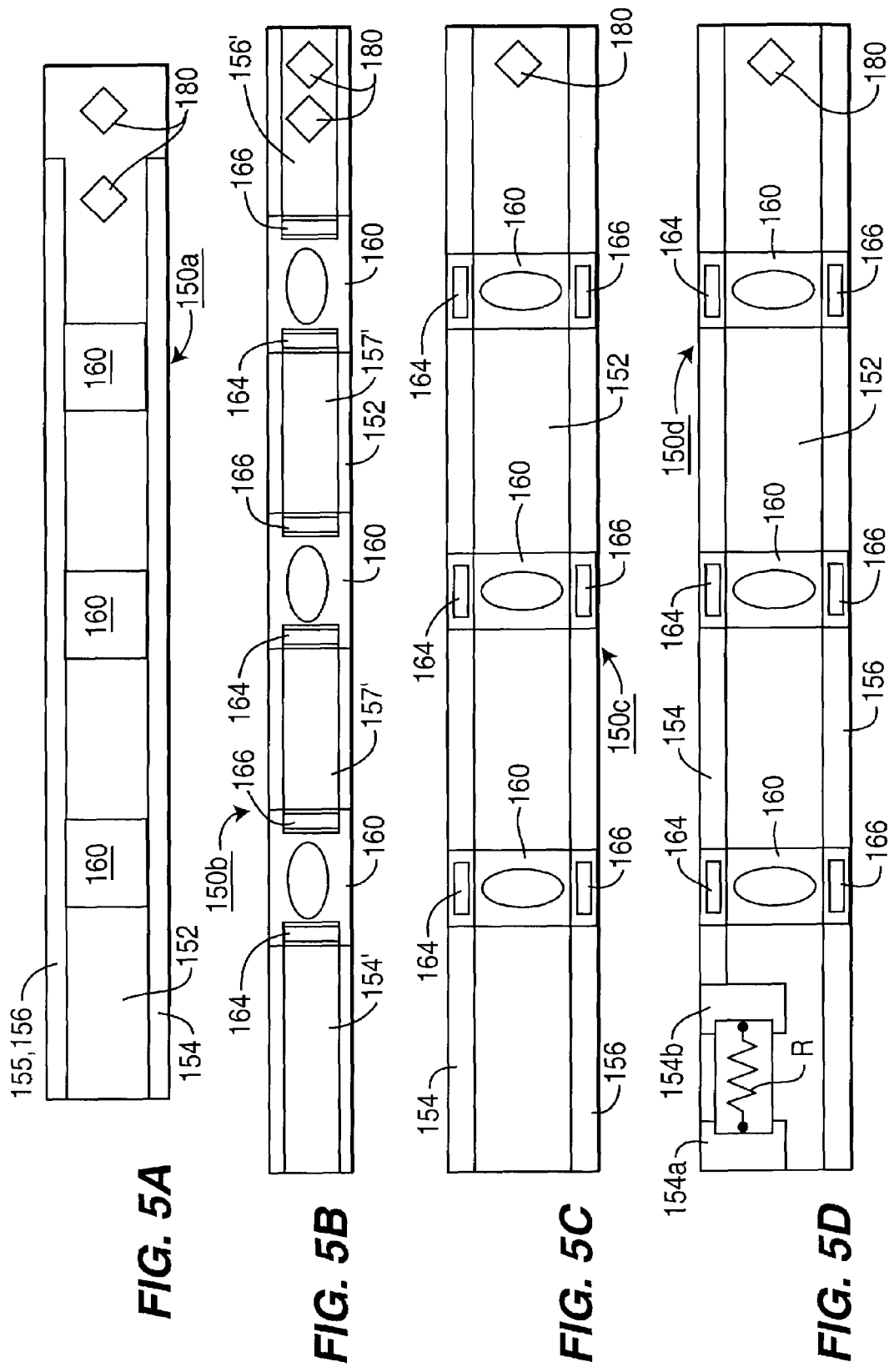

WOVEN ELECTRONIC TEXTILE, YARN AND ARTICLE

This Application claims the benefit of U.S. Provisional Application Ser. No. 60/379,723 filed May 10, 2002, and of U.S. Provisional Application Ser. No. 60/419,159 filed Oct. 17, 2002.

The present invention relates to a woven article and method, and, in particular, to a woven textile and/or article having an electronic circuit woven therein, and a method therefor.

In many fields of endeavor, from military to sport to apparel, a desire exists for electronic circuits to be incorporated into fabric and into articles that may be made of fabric. In some instances, such as electric blankets and electrically conductive fabric, electrically resistive and/or electrically conductive are been woven into fabric with insulating yarn to provide the desired resistance heating and/or conductivity characteristics. In these relatively simple arrangements, the characteristics of the resistive heating yarn determines the heating characteristics of the woven electric blanket and the conductivity of the electrically conductive yarn substantially determines the conductivity characteristic of the fabric. In other words, the number and size of electrically conductive yarn determine the conductivity of the fabric.

Apart from the aforementioned relatively simple arrangements, where electrical functionality of greater complexity has been desired, electrical circuits have been added to fabric after the fabric is woven. Among the approaches are the lamination of electrical circuit substrates to a fabric, e.g., as described in U.S. Patent Publication No. US 2002/0076948 of B. Farrell et al entitled "Method of Manufacturing a Fabric Article to Include Electronic Circuitry and an Electrically Active Textile Article," and the embroidering and/or applique of electrical conductors and circuits onto a fabric, e.g., as described in U.S. Pat. No. 6,210,771 to E. R. Post et al entitled "Electrically Active Textiles and Articles Made Therefrom" and in an article by E. R. Post et al entitled "E-Broidery: Design and Fabrication of Textile-Based Computing" published in the IBM Systems Journal, Volume 39, Numbers 3 & 4, pages 840-860, 2000. In addition, an arrangement attaching electrical components to woven fabric including conductive yarn, such as by connecting the components to the conductive yarn by soldering and/or by electrically conductive adhesive, is described in U.S. Pat. No. 6,381,482 to Jayaraman et al entitled "Fabric or Garment With Integrated Flexible Information Infrastructure."

In the aforementioned arrangements, the electrical electronic function is added after the fabric has been woven, e.g., by embroidery or by applique or by mechanical attachment, thereby adding additional steps and additional complexity to the manufacturing process. In addition, the particular arrangement thereof appears to be suited to one specific application or usage with corresponding specific manufacturing, and does not appear to lend itself to an efficient, relatively general manufacturing wherein the function and operation of the resulting fabric need not be specified or determined until after the fabric is woven, i.e. manufactured.

Accordingly, there is a need for a woven textile and article having an electronic circuit function woven therein.

To this end, the woven article of the present invention comprises a plurality of electrically insulating and/or electrically conductive yarn in the warp and a plurality of electrically insulating and/or electrically conductive yarn in the weft interwoven with the yarn in the warp. A functional yarn in the warp and/or the weft comprises an elongate substrate including at least one electrical conductor and at least one electronic device thereon, wherein the at least one electrical conductor provides an electrical contact for connecting to the electronic device.

BRIEF DESCRIPTION OF THE DRAWING

The detailed description of the preferred embodiments of the present invention will be more easily and better understood when read in conjunction with the FIGURES of the Drawing which include:

FIGS. 5A through 5G are plan view schematic diagrams of example embodiments of yarns including an example electronic circuit function suitable for a woven fabric as illustrated in FIGS. 1 and 3;

Figure 1:
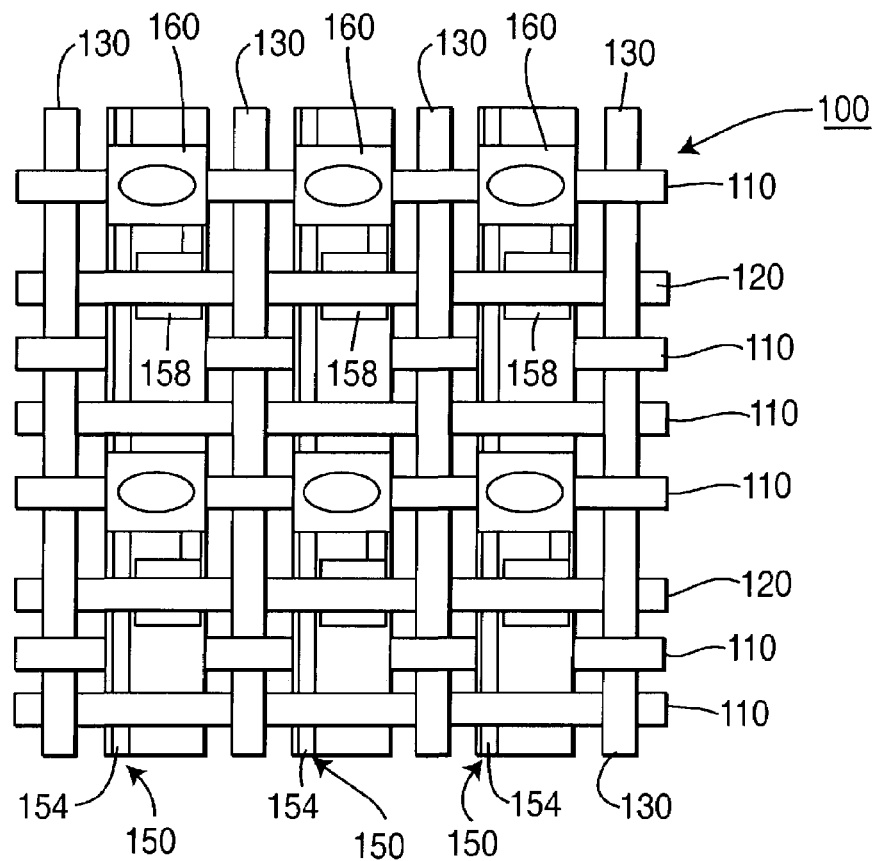
FIG. 1 is a plan view schematic diagram of an example woven fabric including an example embodiment of the invention.

In the Drawing, where an element or feature is shown in more than one drawing figure, the same alphanumeric designation may be used to designate such element or feature in each figure, and where a closely related or modified element is shown in a figure, the same alphanumerical designation primed may be used to designate the modified element or feature. Similarly, similar elements or features may be designated by like alphanumeric designations in different figures of the Drawing and with similar nomenclature in the specification, but in the Drawing are preceded by digits unique to the embodiment described. It is noted that, according to common practice, the various features of the drawing are not to scale, and the dimensions of the various features are arbitrarily expanded or reduced for clarity.

DESCRIPTION OF THE PREFERRED EMBODIMENT(S)

Woven textiles generally comprise two sets of relatively straight yarn, the warp and the weft, which cross and interweave to form a fabric. Typically, the warp and weft yarn cross at approximately a right angle as woven, but may cross at any angle. Also typically, fabric is woven to have a given width, but may have any desired length. The warp yarn runs in the length direction of the fabric, which is generally the longer dimension thereof, and the weft yarn runs in the crosswise or width direction thereof, which is generally the shorter dimension. With a modern computer controlled loom, the weaving process is performed automatically and may be responsive to weaving instructions described in computer instructions and/or derived from a computer aided design program. More complex weaves, such as a Leno weave in which a pair of yarn are intertwined as they are woven, may employ more than two sets of yarn and/or other than a plain weave in the warp and/or weft, are readily made by such modern looms.

The yarn, which is typically long, flexible and relatively thin, is selected to provide the desired strength, wear, laundering, durability and other requirements of the end use to which the fabric is intended to be put. Where ones of the warp and/or weft yarn are electrically conductive, the woven fabric may function in a manner akin to an electrical circuit board, i.e. the electrically conductive yarn provide electrical connections between various locations of the woven fabric, and/or to locations external to the fabric, and/or with electrical and/or electronic components embodied in the fabric, as may be desired.

The embodiments of woven textile and fabric described herein generally include a "functional yarn" which may be in the warp and/or the weft, but is typically in the weft, which includes an elongated electrical and/or electronic substrate on which are disposed one or more electrical conductors and a plurality of electrical and/or electronic devices that connect to one or more of the electrical conductors. In other words, a functional yarn is any electrical and/or electronic substrate that includes electrical conductors and electrical and/or electronic devices that perform an electrical and/or electronic function, wherein the substrate may be utilized as a yarn and woven.

Figure 2:
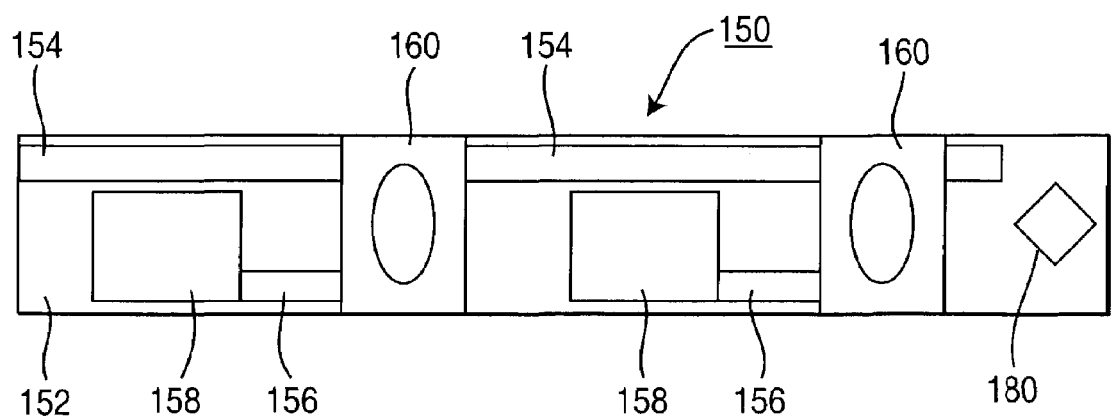
FIG. 2 is a plan view schematic diagram of a yarn including an example electronic circuit function, as for the woven fabric of FIG. 1.

FIG. 1 is a plan view schematic diagram of an example woven fabric 100 including an example embodiment of the invention, and FIG. 2 is a plan view schematic diagram of a yarn 150 including an example electronic circuit function, as for the woven fabric of FIG. 1. Fabric 100 is a plain weave fabric including insulating yarn 110 and electrically conductive yarn 120 in the warp and insulating yarn 130 and functional yarn 150 in the weft. Fabric 100 may also include electrically conductive yarn in the weft. Insulating yarn 110 are disposed between adjacent electrically conductive yarn 120 in the warp to provide an insulating separator therebetween and insulating yarn 130 are disposed between adjacent functional yarn 150 (and/or electrically conductive yarn, if any) in the warp to provide an insulating separator therebetween.

Functional yarn 150 of FIG. 2 includes plural electrical conductors 154, 156, 158 and an electronic device 160 on an insulating electrical or electronic substrate 152. In the specific example of FIGS. 1 and 2, electronic device 160 is a light emitting diode (LED) 160 that emits light in response to electrical signals applied thereto. Substrate 152 is an elongate strip of insulating material, e.g., a polyimide or polyester or other material suitable for use as an electrical substrate. Conductors 154-158 are formed on substrate by any suitable means, such as by etching a conductive metal layer, e.g., copper layer, attached to substrate 152 using known methods for making electrical printed circuits and the like. As illustrated, conductor 154 extends substantially the length of substrate 152 to provide a common connection to all of the LEDs 160 thereon, and an electrical signal for activating LEDs 160 is applied thereto. Conductor 158 provides an electrical contact 158 to which an electrical signal for activating LED 160 is applied, and each contact 158 is connected to a corresponding LED 160 by a conductor 156.

Electrical connection between electrically conductive yarn 120 in the warp and functional yarn 150 and/or electrically conductive yarn in the weft is satisfactorily made by the physical contact therebetween in a plain weave having a typical tightness and/or density of yarn, without any mechanical attaching thereof. Optionally, the electrical connection provided by physical contact, e.g., frictional contact, may be supplemented, e.g., by a mechanical attaching such as a spot of electrically conductive adhesive or solder, at each connection 158. For proper electrical contact, functional yarn 150 is registered so that contacts 158 thereon each underlie a conductive yarn 120 where they cross. To this end, functional yarn 150 may include one or more registration marks or indicia 180 at one end thereof so that the loom may sense the position thereof in the weaving process to provide proper registration.

Optionally, conductor 154 and/or contacts 158 may be coated with an insulating coating, except at locations where an electrical connection is to be made thereto. Also optionally, conductor 154 and/or contacts 158 may have a spot of electrically conductive adhesive applied at locations where an electrical connection is to be made thereto, e.g., at the terminal locations for LEDs 160 and/or at intersections with conductive yarn 120. LEDs 160 may be connected to substrate 152 by any suitable means, e.g., by soldering or electrically conductive adhesive.

Each LED 160 is illuminated by applying a suitable electrical signal between common conductor 154 and the contact 158 associated with the LED. In fabric 100, each conducting yarn 120 intersects functional yarn 150 to overlie one of the contacts 158 thereof. Thus, each LED 160 has one terminal that is connected via contact 158 to a conductive yarn 120 that is accessible at an edge of fabric 100 and has a terminal connected to conductor 154 that is accessible at another edge of fabric 100, and so each LED 160 may be activated by applying an electrical signal to the appropriate ones of conductive yarn 120 and conductors 154. LEDs 160 of fabric 100 are in aggregate an addressable passive-matrix display having row conductors 120 and column conductors 154 by which any one or more of LEDs 160 may be addressed.

Fabric 100 as described is a woven passive-matrix display wherein any pattern of the LEDs 160 may be illuminated by applying appropriate electrical signals between selected ones of conductors 120 and 154. However, with additional conductors and/or electronic devices on functional yarn 150, an active-matrix display and/or a non-matrix display and/or a display having individually addressable pixels (LEDs) may be provided, as described below. Thus, LEDs 160 or any other electronic devices 160 may be energized and/or operated in a programmed pattern and/or sequence, e.g., to provide an alpha numeric or other character display, or to provide a sensor array fabric that sequentially senses different agents and/or processes the sensed data.

It is noted that in an actual application, e.g., a textile or textile article, fabric 100 would likely be much larger and would contain many more yarn of one or more types in both warp and weft, and functional yarn 150 would likely be much longer and contain many more LEDs 160. Thus, FIGS. 1 and 2, as well as other FIGURES herein, may be considered as illustrating a portion of a fabric or a portion of a functional yarn.

Suitable insulating yarn includes, for example, but are not limited to, yarn and/or thread and/or fiber of cotton, wool, silk, linen, flax, silk organza, synthetics, plastic, polyester, and the like, whether fiber, thread, monofilament, multi-stranded, spun, twisted or otherwise constructed, as may or may not be conventional.

Suitable electrically conductive yarn includes, for example, but is not limited to, copper, steel, stainless steel, nickel, silver, gold and/or other metal threads, whether single filament or plural stranded, twisted or braided or a wire or a flat strip, combinations of conductive metal and insulating threads and/or strands, electrically conductive plastics, and the like. One suitable electrically conductive yarn is Aracon® yarn which comprises one or more strands or threads of a metal-coated Kevlar® polymer and is commercially available from E.I. duPont de Nemoirs and Company of Wilmington, Del. Aracon® yarn can have an electrical conductivity approaching that of copper, e.g., about $10^{-3}$ Ohm/cm. Other suitable conductive yarn include metal-wrapped yarns and metal-plated yarn, and the like.

Figure 3:
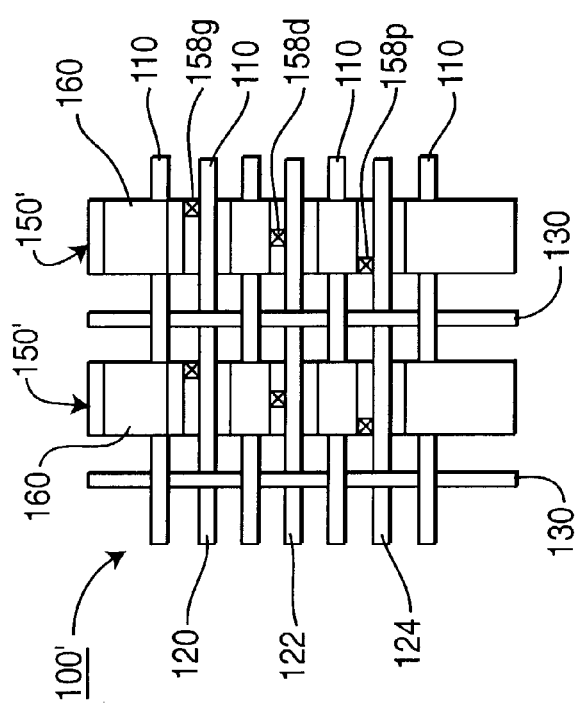
FIG. 3 is a plan view schematic diagram of an example woven fabric including an example embodiment of the invention.
Figure 4:
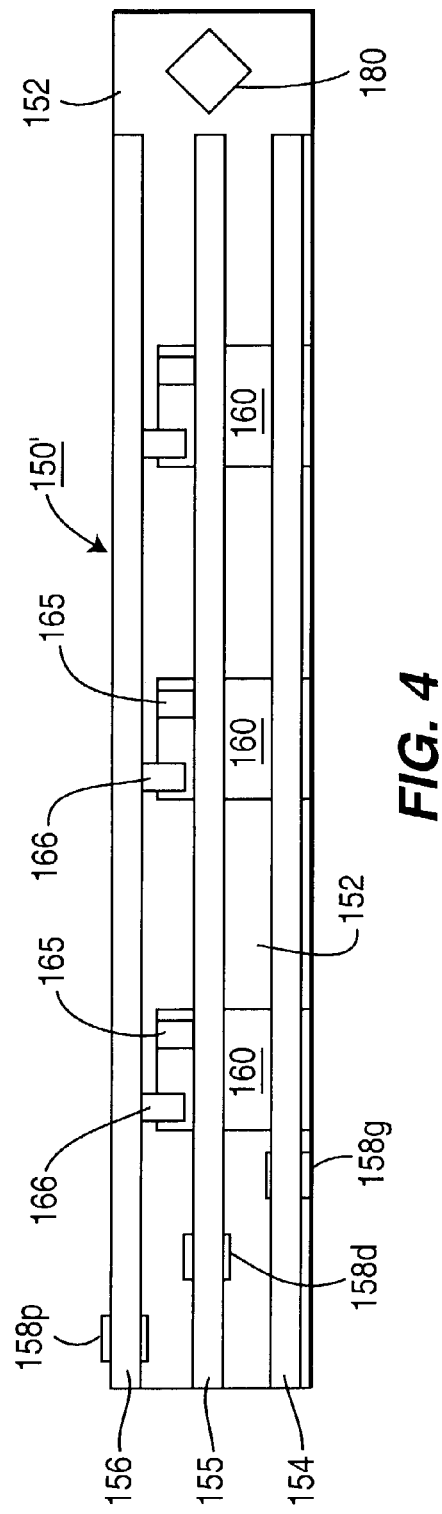
FIG. 4 is a plan view schematic diagram of a yarn including an example electronic circuit function, as for the woven fabric of FIG. 3.

FIG. 3 is a plan view schematic diagram of an example woven fabric 100' including an example embodiment of the invention and FIG. 4 is a plan view schematic diagram of a yarn 150' including an example electronic circuit function, as for the woven fabric of FIG. 3. Fabric 100' is a plain weave fabric including insulating yarn 110 and electrically conductive yarn 120, 122, 124 in the warp and insulating yarn 130 and functional yarn 150' in the weft. Fabric 100' may also include electrically conductive yarn in the weft. Insulating yarn 110 are disposed between adjacent electrically conductive yarn 120, 122, 124 in the warp to provide an insulating separator therebetween and insulating yarn 130 are disposed between adjacent functional yarn 150 (and/or electrically conductive yarn, if any) in the warp to provide an insulating separator therebetween.

Functional yarn 150' of FIG. 4 includes plural electrical conductors 154, 155, 156 and an electronic device 160 on an insulating electrical or electronic substrate 152. In the specific example of FIGS. 3 and 4, electronic device 160 is a sensor, such as a temperature sensor. Substrate 152 is an elongate strip of insulating material, e.g., a polyimide or polyester or other material suitable for use as an electrical substrate.

FIG. 4 is viewed from the "back" as if substrate 152 is transparent so that conductors 154, 155, 156 on the front surface thereof, and sensors 160 attached thereto, are visible. Conductors 154-156 are formed on substrate 152 by any suitable means, such as by etching a conductive metal layer, e.g., copper layer, attached to substrate 152 using known methods for making electrical printed circuits and the like. As illustrated, each of conductors 154, 155 and 156 extend substantially the length of substrate 152 to provide three common connections to all of the sensors 160 thereon. Conductor 154 provides a common or ground connection, conductor 156 provides via contacts 166 a connection for electrical power for each sensor 160. Conductor 155 provides a conductor and contact 165 for applying an electrical signal for activating and/or reading sensor 160 and for receiving an electrical signal comprising data or information read from sensor 160.

Electrical connection between electrically conductive yarn 120, 122, 124 in the warp and conductors 154, 155, 156 of functional yarn 150' and/or electrically conductive yarn in the weft is satisfactorily made by the physical contact therebetween in a plain weave having a typical tightness and/or density of yarn, and may be supplemented, e.g., by a spot of electrically conductive adhesive at each connection 158. For proper electrical contact, functional yarn 150' is registered so that contacts 158g, 158d, 158p thereon each underlie a respective conductive yarn 120, 122, 124 where they cross. To this end, functional yarn 150' may include one or more registration marks or indicia 180 at one end thereof so that the loom may sense the position thereof in the weaving process to provide proper registration.

Optionally, conductors 154, 155 and/or 156 may be coated with an insulating coating, except at locations 158g, 158d, 158p to define contacts 158g, 158d, 158p where an electrical connection is to be made thereto. Also optionally, contacts 158g, 158d, 158p may have a spot of electrically conductive adhesive applied for making an electrical connection is to be made thereto, e.g., at intersections with conductive yarn 120, 122, 124. Sensors 160 may be connected to substrate 152 by any suitable means, e.g., by soldering or electrically conductive adhesive.

Electronic device 160 is preferably an addressable sensor which has a unique identification or address and which, when signaled by a data signal including such identification and/or address via its data terminal 165, performs a particular function. The function performed may be as simple as sensing a presently existing condition, such as temperature, or recording a given condition over a time period, whether for a given period or until again signaled, or may be more complex, such as providing processed data relating to a sensed condition. Each sensor 160 is powered by electrical power applied between conducting yarn 120 and 124 connected to conductors 154 and 156 of functional yarn 150' and is activated by applying a suitable electrical addressing signal between common conductor 154 and data conductor 155, i.e. between conducting yarn 120 and conducting yarn 122. One example of a suitable addressable sensor is type DS18B20X temperature sensor and/or thermostat flip-chip integrated circuit and the like available from Dallas Semiconductor—Maxim Integrated Products, Inc. located in Sunnyvale, Calif.

In fabric 100', each conducting yarn 120, 122, 124 intersects functional yarn 150' to overlie one of the contacts 158 thereof. Thus, each sensor 160 has terminals that are connected via contacts 158g, 158d, 158p to a conductive yarn 120, 122, 124 that is accessible at an edge of fabric 100, so that all of sensors 160 on all of functional yarn 150' of fabric 100' are accessible from a single edge of fabric 100'. In addition, where conductive yarn 120, 122, 124 are in the warp and functional yarn 150' are in the weft, fabric 100' may be woven to any desired length and be connected at one edge in the same format, e.g., at a single interface that may be standardized. Alternatively, fabric 100' may be cut into any desired length and each length may be connected via the standardized interface. Also alternatively, conductors 154, 155, 156 may be continuous over substantially the length of functional yarn 150' in which case only three conductive yarn 120, 122, 124 may be necessary to address addressable sensors 160, or conductors 154, 155, 156 may be discontinuous over the length of functional yarn 150' in which case more than three conductive yarn 120, 122, 124 may be necessary to address sensors 160.

Thus, sensors 160 of fabric 100' are in aggregate an addressable sensor matrix display having conductors 120, 122, 124 available at a single edge by which any one or more of sensors 160 may be addressed. It is noted that in an actual application, e.g., a textile or textile article, fabric 100' would likely be much larger and contain many more yarn of all types in both warp and weft, and functional yarn 150 would likely be much longer and contain many more sensors 160. Thus, FIGS. 3 and 4, as well as other FIGURES herein, may be considered as illustrating a portion of a fabric or a portion of a functional yarn.

Connectors and/or batteries and/or other components needed to connect with and/or operate fabric 100 may be attached to or incorporated into fabric 100, either at an edge or edges thereof or at another convenient location. Examples of such components include, for example, decoders and/or drivers for LEDs, and/or for one or more rows and/or columns of LEDs, however, such components are preferably disposed on functional yarn 150.

Figure 5E:
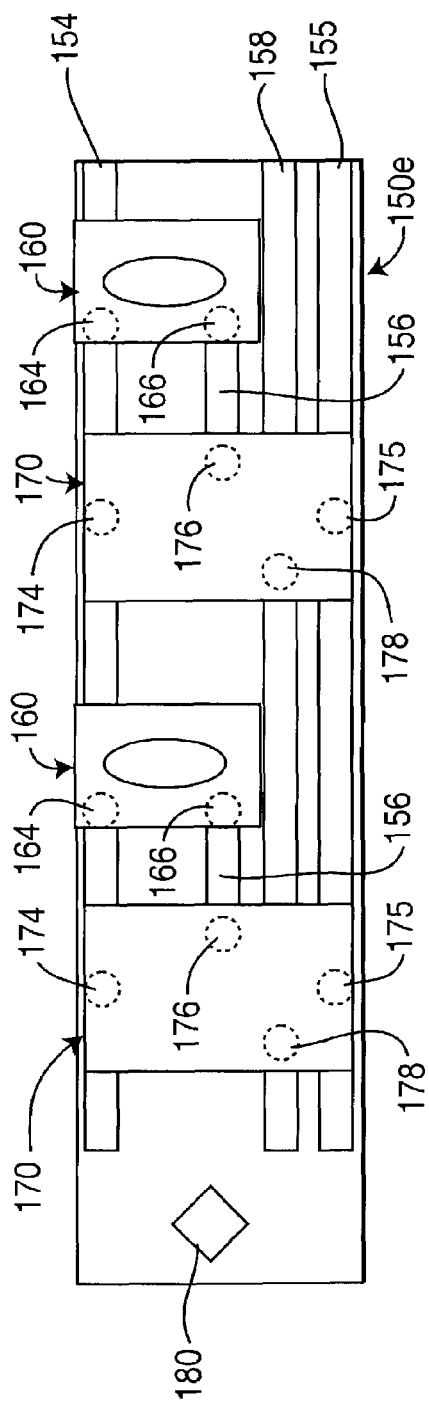
Figure 5F:
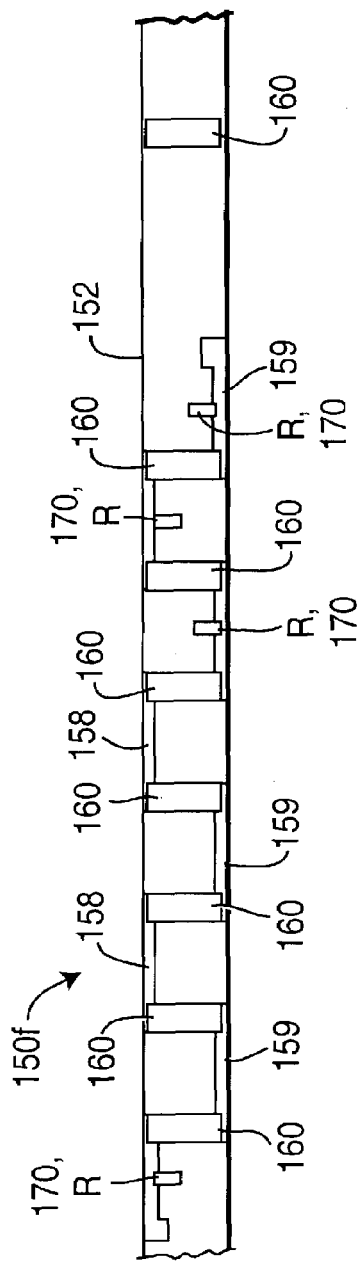
Figure 5G:
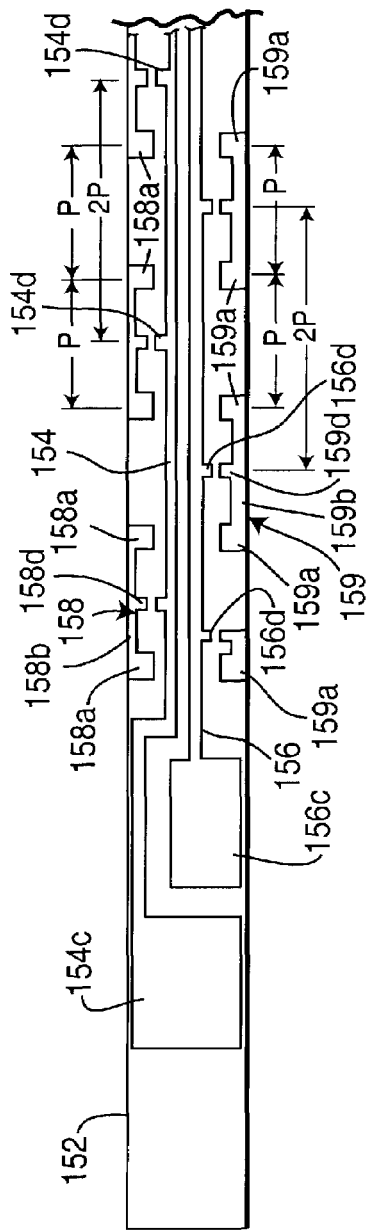

FIGS. 5A through 5G are plan view schematic diagrams of example embodiments of yarns 150a-150f including an example electronic circuit function suitable for a woven fabric 100 as illustrated in FIGS. 1 and 3. FIGS. 5A-5D are viewed from the "back" as if substrate 152 is transparent so that conductors 154, 155, 156, 157 and/or 158 on the front surface thereof, and electronic devices 160 attached thereto, are visible. FIGS. 5E-5G are viewed from the front.

FIG. 5A is an example embodiment of a functional yarn 150a which includes an elongate substrate 152 on which are two conductors 154, 155 extending substantially the length thereof. Conductor 154 may be a ground conductor and conductor 155 may be a power and data (signal) conductor. In this arrangement, electronic devices 160 may be of the sort that derive their operating power from the data and/or signals on data conductor 155. Alternatively, electronic devices 160 may be powered via power conductor 155 by superimposing the data and/or signals on the power signal. One example of a sensor device 160 suitable for such arrangement is the type DS18B20X temperature sensor available from Dallas Semiconductor—Maxim Integrated Products, Inc. Thus, functional yarn 150a may be, for example, a two-conductor equivalent of the three-conductor functional yarn 150' of FIG. 4. Functional yarn 150a may include one or more registration indicia 180.

FIG. 5B is an example embodiment of a functional yarn 150b which includes plural light-emitting elements 160 connected in series on an elongate substrate 152. A first terminal 166 of a first LED 160 receives electrical power from power conductor 156' and a second terminal 164 of a last LED 160 connects to ground potential via conductor 154'. Terminals 164, 166 of intermediate LEDs 160 connect in series via conductors 157' therebetween. While all of LEDs 160 may be caused to illuminate by applying suitable potential between conductors 154, 156, thereby to illuminate functional yarn 160 as a strip, intermediate potentials may be applied, e.g., via crossing conductive yarn 120 (not shown), to cause selected ones of LEDs 160 to illuminate and others of LEDs 160 to not illuminate. Brightness may be selected by suitably selecting the potential applied and/or the current that flows. As above, functional yarn 150b may include one or more registration indicia 180.

FIG. 5C is an example embodiment of a functional yarn 150c which includes plural light-emitting elements 160 connected in parallel on an elongate substrate 152. A first terminal 166 of each LED 160 receives electrical power from power conductor 156 and a second terminal 164 of each LED 160 connects to ground potential via conductor 154. All of LEDs 160 are caused to illuminate by applying suitable potential between conductors 154, 156, thereby to illuminate functional yarn 160 as a strip, and brightness may be selected by suitably selecting the potential applied and/or the current that flows. Suitable LEDs for functional yarn include those available from Nichia Corporation of Japan, and from other sources, which may include LEDs producing "white" as well as other colors of light, such as red, green, blue, amber and/or a combination thereof, as well as LEDs that are switchable between two or more colors. As above, functional yarn 150c may include one or more registration indicia 180.

FIG. 5D is an example embodiment of a functional yarn 150d which is the same as functional yarn 150c of FIG. 5C except that it includes a current-limiting resistor R. Resistor R is in series with parallel-connected LEDs 160 to limit the current flowing therethrough to conductor 154b in response to the potential applied at conductor or contact 154a. LEDs 160 are connected in parallel between conductors 154b and 156. Alternatively and optionally, a current-limiting resistor R could be provided for each LED 160 or for groups of LEDs 160, of functional yarn 150d. Also alternatively and optionally, a current-limiting resistor R could be provided for each LED 160 or for groups of LEDs 160, of functional yarn 150c described above. As above, functional yarn 150d may include one or more registration indicia 180.

FIG. 5E is an example embodiment of a functional yarn 150e which includes additional conductors 155 and electronic devices 170 on functional yarn 150, as may be employed to provide a woven non-matrix display having individually addressable pixels (LEDs) 160. Extending substantially the length of substrate 152 is conductor 154 connecting to all of the devices 160 at terminal 164 thereof and to electronic devices 170 at terminal 174 thereof, e.g., for providing a ground connection. Extending substantially the length of substrate 152 is conductor 158 connecting to all of electronic devices 170 at terminal 178 thereof, e.g., for providing a power connection. Also extending substantially the length of substrate 152 is conductor 155 connecting to all of electronic devices 170 at terminal 175 thereof, e.g., for providing a data signal thereto for addressing electronic devices 170 for selectively applying electrical power from conductor 158 to terminal 168 of LED 160 via output terminal 176 and conductor 156. As above, functional yarn 150e may include one or more registration indicia 180.

Electrical power is thus applied to all of electronic devices 170 via power conductor 158 and is selectively applied to ones of electronic devices 160 via the ones of electronic devices 170 that are addressed by the addressing signals, e.g., serial addressing signals, provided via data conductor 155. Electronic device 170 is preferably an addressable switch which has a unique identification or address and which, when signaled by a data signal including such identification and/or address via its data terminal 175, performs a particular function. The function performed may be as simple as making or breaking a connection between two of its terminals 176 and 178, whether for a given period or until again signaled, or may be more complex, such as providing a width-modulated or time modulated or a frequency signal at or between one or more of its terminals.

In a functional yarn 150e for a simple non-scanned, non-matrix array of light-emitting pixels, the state of each pixel may be set by addressing the appropriate switch and setting its state, e.g., either "on" or "off," to set the state of the pixel to either "on" or "off." One example of a suitable addressable switch is type DS2406 available from Dallas Semiconductor—Maxim Integrated Products, Inc. located in Sunnyvale, Calif. Such functional yarn 150e and a woven fabric display including same, employs serial addressing and is suitable for displaying still images and/or text or character messages. A fabric display may also be utilized for displaying moving images, e.g., video-rate displays, if sufficient addressing bandwidth or parallel addressing is available. Because an LED is emissive, it can produce a display that is not only easily seen in the dark, but may also be seen in daylight.

FIGS. 5F and 5G are an example embodiment of a functional yarn 150f which includes power and ground conductors 154, 156, various resistors R, and electronic devices 160 on functional yarn substrate 152, as may be employed to provide a woven non-matrix display having a pattern of electronic devices 160, e.g., LEDs 160, thereon. In particular, functional yarn 150f has a yarn substrate 152 that may be utilized with various different ones of devices 160 and resistors R attached thereto, e.g., in various serial and/or parallel circuits, as may be advantageous for making a unique and/or a specialized functional yarn. A portion of yarn substrate 152 is shown in FIG. 5G without electronic devices 160 and resistors R mounted thereon.

Spaced apart at a pitch 2P along the opposing edges of substrate 152 are conductor patterns 158 and 159 having respective contacts 158a, 158d and 159a and 159d to which electronic devices 160 and resistors R may be connected. Spaced apart at a pitch P along the opposing edges of substrate 152 are pairs of contacts 158a, 159a of patterns 158, 159 to which electronic devices 160 may be attached. Alternating adjacent pairs of contacts 158a are connected to each other by a conductor 158b which includes a contact 158d extending away from the edge of substrate 152, and alternating adjacent pairs of contacts 159a are connected to each other by a conductor 159b which includes contact 159d extending away from the edge of substrate 152. Conductors 158b, 159b are typically disposed alternatingly with respect to the pairs of contacts 158a and 159a so that plural devices 160 may be connected in series, if desired, and so that contacts 158d and 159d alternate at a pitch 2P.

Extending substantially the length of substrate 152 of functional yarn 150f in a central region thereof is conductor 154 providing a plurality of contacts 154d at which a connection, e.g., to ground, may be made via conductor 154. Also extending substantially the length of substrate 152 in the central region thereof is conductor 156 providing a plurality of contacts 156d at which a connection, e.g., to a source of power, may be made via conductor 156. Contacts 154d and contacts 156d are typically spaced apart at a pitch 2P and are disposed so as to be proximate respective ones of contacts 158d and 159d so that electronic devices 170, such as resistors R, may be mounted therebetween. Near one or both ends of functional yarn 150f are contacts 154c and 156c for respectively connecting conductors 154 and 156 to external circuits, such as to sources of power and ground potential. Conductors 154, 156, 158, 159 and the contacts thereof are typically an etched copper pattern on an insulating substrate 152, and may be covered by an insulating coating other than at the various contacts thereof.

In the example embodiment illustrated in FIG. 5F, the five electronic devices 160 (e.g., LEDs) at the left of the FIGURE are connected in series via ones of conductor patterns 158, 159 and the series connected devices 160 are connected to conductors 154 and 156 via two resistors R which are of ohmic value selected for a desired value of current flow through devices 160 with a specified value of potential applied between conductors 154, 156. Because there are two resistors R in series with the series connected devices 160, the necessary resistance value may be divided between the two resistors R in any desired proportion. Typically, one resistor R is of low ohmic value (e.g., 1 ohm) to serve as a jumper between one pair of connections 154d, 158d or 156d, 159d, and the other resistor R is a higher ohmic value (e.g., 100 ohms) connected between another pair of connections 154d, 158d or 156d, 159d, to determine the level of current flow through devices 160.

In an example embodiment of a functional yarn 150f, substrate 152 has a length of about 40 cm and a width of about 4 mm and is of a polyimide material. Series connections of between one and five LEDs 160 are provided, with contacts 158a, 159a each being about 1 mm by 2 mm in area and repeating at a pitch of about 9.5 mm. Contacts 154d, 156d, 158d and 159d are each about 0.5 mm by 0.5 mm, and are separated by a gap of about 0.6 mm. LEDs 160 operate at a current of about 20 milliamperes with about 12 volts is applied between conductors 154 and 156. For five LEDs 160 connected in series, a 1-ohm resistor R and a 100-ohm resistor R are utilized, whereas for a lesser number of LEDs 160 in series a higher value resistor R is utilized. Where two series circuits of LEDs 160 draw current through the same resistor R, the value of that resistor R is reduced proportionately so that about 20 milliamperes flows in each of the two series circuits of LEDs 160. A number of functional yarn 150f each having a different predetermined pattern of LEDs 160 mounted thereto were woven into the weft of an about 1.35 m by 0.37 m (about 53 inch by 14.5 inch) banner sign wherein the LEDs 160 when illuminated formed characters and/or symbols spelling out a message, e.g., "Wonders Never Cease." Conductive yarn of braided copper was woven into the warp thereof to make frictional electrical connection to contacts 154a, 156a of each functional yarn 150f for applying the 12 volt operating potential and ground potential thereto. Insulating yarn provides a desired spacing of the conductive yarn and the functional yarn 150f in the warp and weft of the woven sign.

Examples of electrical and/or electronic devices and/or components that may be included on a functional yarn include, for example, but are not limited to, sensors of temperature, chemicals, force, pressure, sound, an electric field, a magnetic field, light, acceleration and/or any other condition, sources of light, force, heat, electromagnetic radiation and/or sound, infra red and/or wireless transmitters and/or receivers, imagers, CCD imagers, thermoelectric sensors, coolers, heaters and/or generators, liquid crystal elements, electro-luminescent elements, organic light-emitting elements, OLEDs, electrophoretic materials, LEDs, piezo-electric elements and/or transducers, microphones, loudspeakers, acoustic transducers, resistors, processors, digital signal processors, microprocessors, micro-controllers, CPUs, analog-to-digital converters, digital-to-analog converters, a data-producing device, a data-utilizing device, a processing device, a switch, a human-interface device, a human-input device, a blinker and/or flasher, a battery, a solar cell, a photovoltaic device, a power source, and so forth. Any one or more or all of such devices may be activated by simply applying electrical power thereto, whether via one or more conductors, and/or may be actively addressable in response to an addressing signal applied thereto.

Typically, one or more conductors on a functional yarn serve to conduct electrical power and/or ground potential to electronic devices thereon, and one or more other conductors may serve to conduct data to or from such devices. Sources of electrical power connected to various conducting yarn and/or functional yarn include one or more batteries, solar cells, photovoltaic devices and/or other power sources, either external to the fabric and/or attached to the fabric and/or to a functional yarn.

One or more data and/or signal conductors may communicate data and/or signals to and/or from one or more external sources and/or electronic devices on functional yarn, and/or may communicate data and/or signals between electronic devices on functional yarn. All electronic devices on a functional yarn need not be of the same or like kind. For example, a combination of sensors and processors may be included on one or more functional yarn, whereby data is may be collected, sensed, distributed and/or processed within a functional yarn and/or plural functional yarn of a woven fabric. Thus, electronic devices on a functional yarn may be networked together and/or may be networked with other electronic devices on another functional yarn or external to the fabric.

Typically, functional yarn is slit or cut from a sheet of a polyimide or polyester or other polymer material and is about 0.2 to 0.5 mm in width and about 0.01 to 0.25 mm thick, but the material may be wider or narrower and/or thicker or thinner. Other suitable sizes for the functional yarn may be in the range 0.3 to 3 mm in width and about 75 to 125 µm thick. For example, an about 1 mm wide and about 0.1 mm thick functional yarn has been found satisfactory for weaving 0.1-0.4 meter wide fabric. On an automatic loom, e.g., such functional yarn can be inserted into the weft by a standard rapier loom. If the functional yarn is to be woven in the weft of a fabric, then it is as long as the width of the fabric, and if the functional yarn is to be woven in the warp of a fabric, then it is as long as the length of the fabric or longer. Although functional yarn may be similar to a conventional slit-film yarn in that it is slit from a sheet of material, it differs substantially in that conventional slit-film yarn does not include any electrical and/or electronic device and/or functionality as described herein.

It is noted that the functional yarn may be fabricated as a sheet or panel of electrical substrate having electrical conductors formed thereon or applied thereto, and having electrical and/or electronic devices attached and/or applied thereon, which sheet or panel is then cut or slit or otherwise separated into individual functional yarn. For example, a sheet of polyimide, polyester or other plastic suitable for use as an electrical substrate, has a layer of conductive material thereon that is patterned, e.g., as by photo-etching, to form the electrical conductors for power, ground, data and the like as desired. Alternatively, the conductor pattern could be printed with an electrically conductive ink or epoxy or adhesive. Typically, electronic devices are attached as flip-chip and/or surface mount devices. If electronic devices are to be connected using solder or conductive adhesive, then balls of solder or conductive adhesive may be deposited on the conductors in the positions where the terminals of the electronic devices are to connect. The electronic devices are then placed on the substrate and connected via their terminals to the substrate. A coating, e.g., an epoxy or "glop-drop" or "glob-drop" coating, or an insulating film, may be applied thereover to additionally secure the electronic devices to the substrate and/or to smooth any edges or projections that might snag or otherwise interfere with the weaving process. An underfill encapsulation may also be employed. The sheet substrate is then slit or otherwise cut into strips, or is cut in a serpentine pattern, wherein each strip is a length of one or more functional yarn having electrical conductors and electronic devices thereon. Typically, the length of each strip is the length of one functional yarn, but may be a multiple thereof.

Functional yarn may also be fabricated as a strip or roll of electrical substrate having electrical conductors formed thereon or applied thereto, and having electrical and/or electronic devices attached and/or applied thereon to provide a functional yarn, which strip or roll may include plural functional yarn and is then slit to separate individual lengths of functional yarn or may include a single width of functional yarn and so need not be cut or slit or otherwise separated into individual functional yarn. Electrical conductors are formed on the strip and electronic devices connected thereon in like manner to that described above. Each strip or roll of functional yarn contains many lengths of functional yarn and is cut to the length of one functional yarn as fed to the loom for weaving. The functional yarn may be coated as above.

Figure 6A:
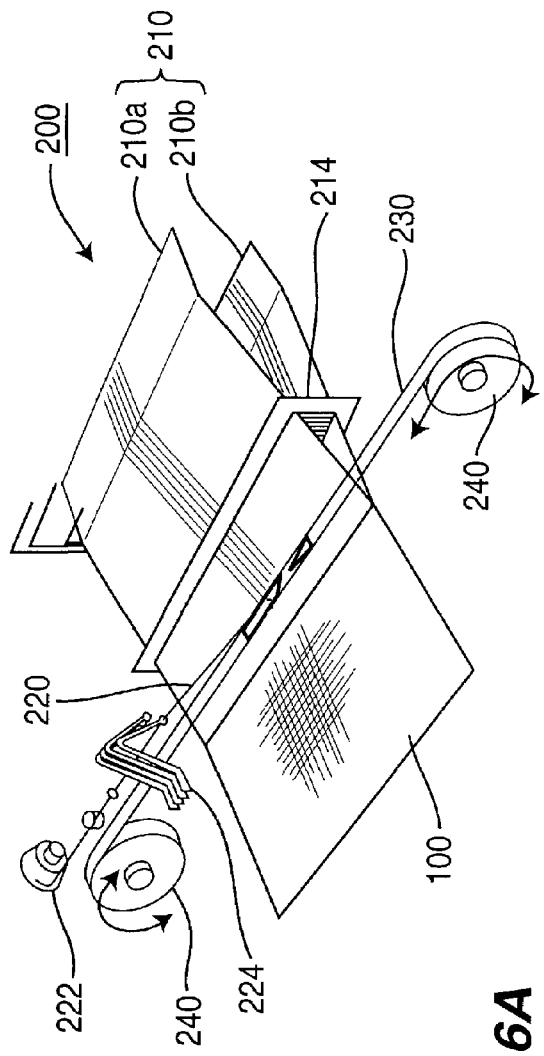
FIGS. 6A and 6B are schematic diagrams illustrating example loom arrangements suitable for making example embodiments of fabric described herein.
Figure 6B:
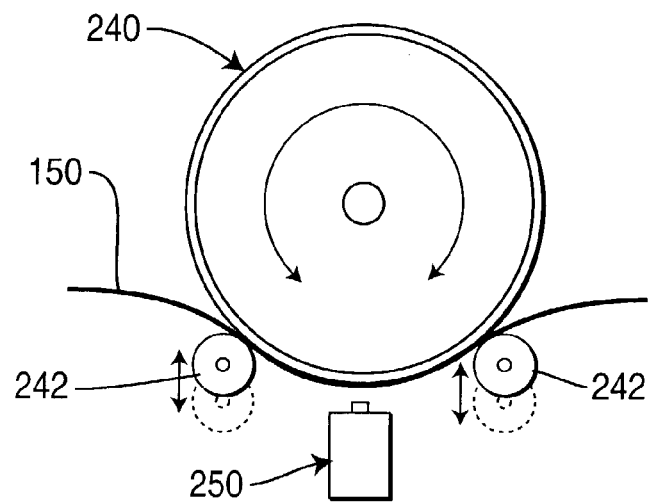

FIGS. 6A and 6B are schematic diagrams illustrating example loom arrangements suitable for making the example embodiments described herein. Rapier loom 200 weaves warp yarn 210 and weft yarn 220 into a fabric or textile 100. Alternate first ones 210a of the warp yarn 210 are raised and second ones 210b of the warp yarn 210 intermediate therewith are lowered whilst weft yarn 220 drawn from weft supply 222 is pulled between the raised and lowered warp yarn 210a, 210b, respectively, by rapier 230. Comb or reed 214 maintains the spacing and position of warp yarn 210 in the opening or shed formed by separated warp yarn 210a, 210b being raised and lowered alternately during weaving. Typically, rapier 230 is a flexible rapier 230 and is pulled back and forth between rapier capstan wheels 240 for pulling weft yarn 220 from weft supply 222 and through the space between raised and lowered warp yarn 210a, 210b. Then, the raised first warp yarn 210a are lowered and the lowered second warp yarn 210b are raised and another weft yarn 220 from weft supply 222 is pulled therebetween by rapier 230. Next, the raised second warp yarn 210b are lowered and the lowered first warp yarn 210a are raised and another weft yarn 220 from weft supply 222 is pulled therebetween by rapier 230, and the weaving sequence repeats interweaving warp and weft yarn 210, 220 for weaving fabric/textile 210.

Warp yarn 210 may include insulating yarn, electrically conductive yarn and/or functional yarn, in any desired sequence. Typically, one or more insulating yarn are woven between electrically conductive yarn and/or functional yarn to provide physical spacing and electrical insulation between adjacent ones thereof.

Where weft supply 222 provides weft yarn 220 of different colors or of different types, such as insulating yarn, electrically conducting yarn and/or functional yarn, selector 224 selects the appropriate weft yarn 220 at the appropriate times for providing the sequence of weft yarn desired for fabric 100. Where weft yarn 220 is electrically conducting, for example, selector 224 selects an insulating yarn 220 for the weft threads woven prior to and following the insulating yarn, so that adjacent conductive yarn are not contiguous, but are separated by an insulating yarn and so are insulated one from the other. In some cases, however, it may be desired that plural conductive yarn be contiguous, e.g., in parallel for increasing current carrying capacity and/or increasing the reliability of the contact with conductive warp yarn and/or functional warp yarn at the crossings thereof.

Where, for example, it is desired to produce a fabric or textile 100 wherein different functional yarn are woven into the weft, weft supply 222 provides functional weft yarn 220 of different colors or of different types, selector 224 selects the appropriate functional weft yarn 220 at the appropriate times for providing the sequence of weft yarn desired. One example of a fabric employing different functional yarn is a multicolor display fabric, as for a two-color, three-color, or full-color display. In such case, weft supply 222 selects the functional weft yarn having the appropriate color light emitters thereon. For example, functional yarn having LEDs producing red light, functional yarn having LEDs producing green light, and functional yarn having LEDs producing blue light may be woven into fabric 100 in a red-green-blue sequence for providing a display fabric having the capability to produce color images when the red, green and blue light emitting elements are activated at suitable times and at suitable illumination intensities.

FIG. 6B is a schematic diagram illustrating an example capstan 240 and roller 242 arrangements suitable for utilization with the example loom 200 of FIG. 6A. Capstan wheel rotates clockwise and counterclockwise, i.e. bidirectionally, for feeding any weft yarn in weaving by loom 100. Rollers 242 are spring loaded or otherwise biased so as to press against capstan wheel 240 so as to maintain the weft yarn in frictional contact therewith so that it can be inserted into the weft of the fabric/textile being woven by loom 100. In particular, functional weft yarn 150 is so woven by capstan wheel 240 into the weft of a fabric. So that functional yarn 150 may be properly positioned with respect to the weft direction of fabric 100, sensor 250 is positioned proximate capstan wheel 240 in a location where one or more registration indicia 180 of functional yarn 150 may be detected. Sensor 250 may be an optical detector for detecting one or more optical (e.g., reflective) indicia on functional yarn 150 and/or may be an electrical detector such as a continuity detector for detecting one or more electrically conductive (e.g., metal contact) indicia 180 of functional yarn 150 and/or may be a mechanical detector for detecting one or more mechanical features of functional yarn 150.

Alternatively, an arm attached to loom 100 may be utilized pull the yarn out of the shed to counter the rapier pulling the yarn into the shed, thereby to properly position functional yarn 150 and register elements thereof. Also alternatively, where the rapier is designed to draw the weft yarn into the shed a predetermined distance with suitable tolerance, registration mark(s) 180 may be utilized to position functional yarn 150 in predetermined manner for subsequently being drawn into the loom by the predetermined rapier distance.

Figure 7:
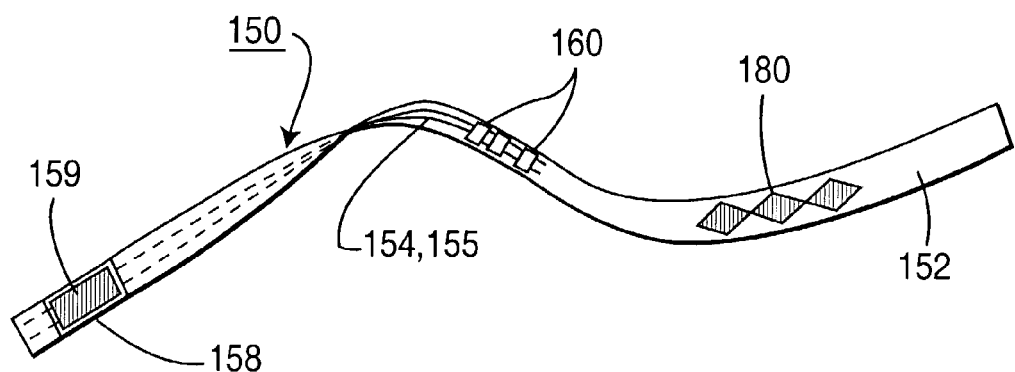
FIG. 7 is a schematic diagram of an example yarn including an example electronic circuit function suitable for use with the example loom arrangements of FIGS. 6A-6B.

FIG. 7 is a schematic diagram of an example yarn 150 including an example electronic circuit function suitable for use with the example loom arrangements 200 of FIGS. 6A-6B. Functional yarn 150 includes a flexible substrate 152 suitable for carrying electrical and/or electronic circuits thereon. For example, substrate 152 carries a plurality of electrical circuit components 160 attached thereto and connecting to conducting circuit traces 154, 156. External connection to conductors 154, 156 of functional yarn 150 is made via one or more contacts 158, an illustrated example of which is located at or near one or both ends of substrate 152. Secure and/or permanent connection thereto may be made, for example, by an electrically conductive adhesive 159, such as a thermoplastic or thermosetting adhesive, which is typically filled with electrically conductive particles, which is set or cured under heated compliant pressure pads or rollers. Functional yarn 150 also typically includes one or more registration marks or indicia 180 located at or near one end of yarn 150 for registering functional yarn 150, e.g., with respect to the warp yarn when functional yarn 150 is utilized in the weft. Such registration of functional yarn 150 is, for example, for positioning contacts 158 in locations in fabric 100 wherein they will make electrical connection with conductive yarn in the warp thereof and/or for positioning electronic devices 160 with respect to each other and fabric 100. To this end, registration indicia 180 is in known predetermined position along the length of substrate 152 of functional yarn 150 with respect to contacts 158 and/or electronic components/devices 160 thereof. Mark(s)/indicia 180 may be of any desired shape and may be optically reflective when intended for use with an optical detector and/or may be electrically conductive when intended for use with an electrical continuity or conductivity detector. Registration mark(s) 180 may also be utilized for properly aligning functional yarn on the loom where functional yarn is utilized in the warp of the fabric.

Figure 8:
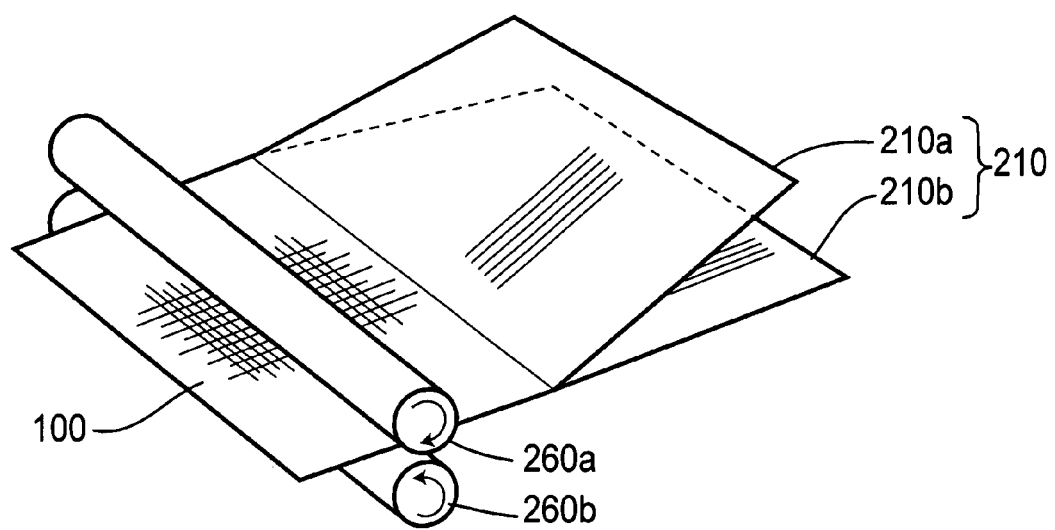
FIG. 8 is a schematic diagram of an example roller arrangement suitable for finishing fabric woven in accordance with FIGS. 6A-6B and 7.

FIG. 8 is a schematic diagram of an example roller arrangement 260 suitable for finishing fabric woven in accordance with FIGS. 6A-6B and 7. Optional roller 260 includes a pair of heated rollers 260a, 260b between which woven fabric 100 passes as it is woven on loom 200. Where functional yarn 150 includes, e.g., thermoplastic and/or thermosetting electrically conductive adhesive for making connection thereto, heated rollers 260a, 260b apply suitable heat and pressure for melting a thermoplastic adhesive and/or for melting and/or curing a thermosetting adhesive.

Figure 9:
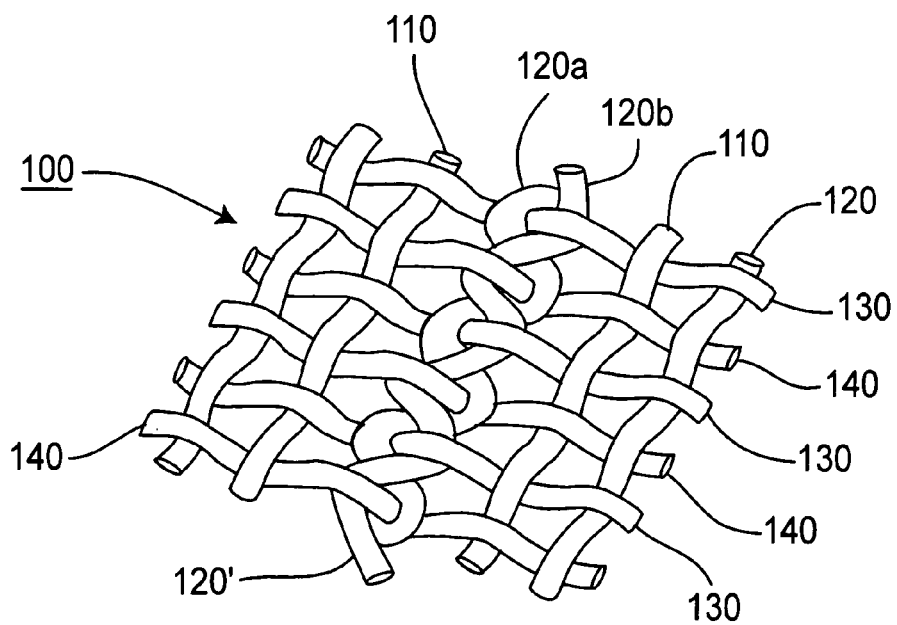
FIG. 9 is a schematic diagram of an example woven textile illustrating an ordinary weave and a complex weave useful in connection with the arrangements of FIGS. 1 to 5G.

FIG. 9 is a schematic diagram of an example woven textile 100 illustrating an ordinary weave and a complex weave which may be utilized in connection with any of the functional yarn arrangements of FIGS. 1 to 5G. Example fabric 100 includes insulating yarn 110 and electrically conductive yarn 120 in the warp and insulating yarn 130 and conductive yarn 140 in the weft. Ordinarily, electrical connection between electrically conductive yarn 120 in the warp and electrically conductive yarn 140 in the weft is satisfactorily made by the physical contact therebetween in a plain weave having a typical tightness and/or density of yarn, as are connections between conductive yarn 120 and/or 140 and a functional yarn. Fabric so made have been observed to exhibit stable connection, e.g., as in bright, stable light from LEDs, under the application of shearing forces to the fabric, bending the fabric, and otherwise distorting and/or conforming the fabric shape.

For looser weaves and/or where highly reliable electrical contact is important, a more complex weave may be employed. For example, a Leno weave having plural conductive yarn 120a and 120b twisted intertwined as they are woven to provide an electrically conductive yarn 120' may be utilized. Because the two conductive yarn 120a, 120b wrap around conductive yarn 140 (and/or a functional yarn) at locations where they cross, providing a tight weave and a connection of higher reliability thereat. While intertwined conductive yarn 120' is illustrated by way of example as being in the warp, intertwined conductive yarn may be utilized in the warp and/or the weft and intertwined yarn may be utilized with insulating and/or conductive yarn.

While the electrically conductive yarn and the functional yarn are generally orthogonal and cross in a woven fabric or textile, the conductive and functional yarn need not be orthogonal, and conductive yarn and functional yarn may run in the same weave direction in a fabric or textile. Further, while either or both electrically conductive yarn and functional yarn may be woven in either or both the warp and/or the weft, it is generally preferred that electrically conductive yarn be woven in the warp and functional yarn be woven in the weft, for example, to permit different functional yarn to be utilized in a fabric/textile. For example, by utilizing a first type of functional yarn containing sensors and/or light sources and a second type of functional yarn containing processors in the same fabric, a "smart" fabric may be woven that both senses data and processes the data sensed and/or that generates addressing for illuminating light sources and illuminates the addressed light sources.

Figure 10A:
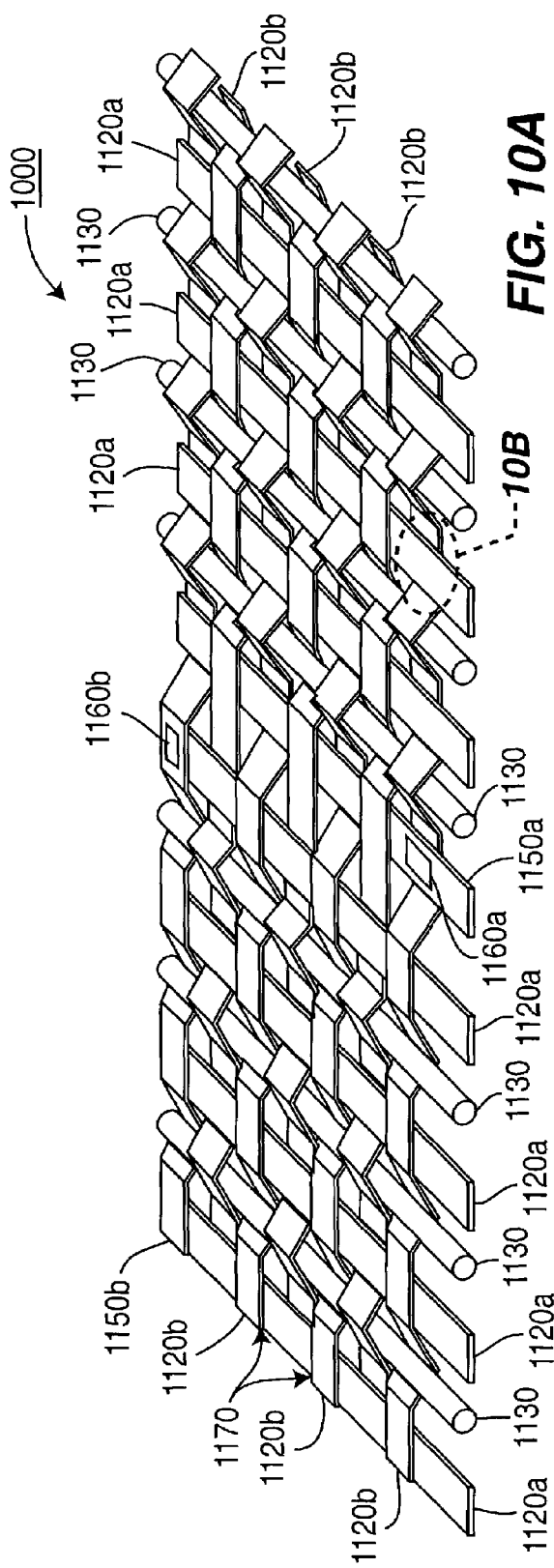
FIG. 10A is an isometric view schematic diagram of an embodiment of an example woven article including liquid crystal elements.
Figure 10B:
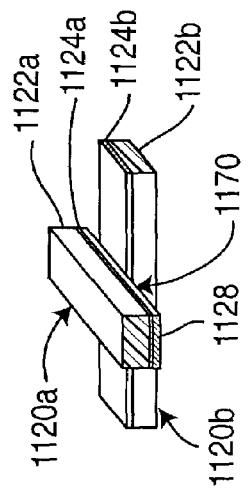
FIG. 10B is an enlargement of a portion thereof.

FIG. 10A is an isometric view schematic diagram of an embodiment of an example woven article 100 including liquid crystal elements 1170, and FIG. 10B is an enlargement of a portion thereof. Article 1000 includes conductive yarn 1120a, insulating yarn 1130 and functional yarn 1150a woven in one weave direction (i.e. warp or weft) and includes conductive yarn 1120b and functional yarn 1150b woven in the other weave direction (i.e. weft or warp). Article 1000 may illustrate a woven article or only a portion of a woven article, and may include additional yarn, i.e. conductive yarn and/or insulating yarn and/or functional yarn, woven in the warp and/or weft, as desired.

Each conductive yarn 1120a includes an insulating substrate 1122a, e.g., of polyester, and a conductive coating 1124a thereon, e.g., preferably of indium tin oxide (ITO) or polyethylene-dioxythiophene (PDOT) or other conductor that may be made thin enough to be substantially transparent.

Yarn 1120a further includes a layer of an optically active material 1128 on the conductive ITO layer 1124a. Examples of optically active materials include, e.g., a liquid crystal (LC) material, polymer dispersed LC material such as dispersed cholesteric LC, electro-luminescent (EL) materials, organic light emitting devices (OLED) materials, electrophoretic materials, light emitting diodes (LEDs), and the like.

Each conductive yarn 1120b includes an insulating substrate 1122b, e.g., of polyester, and a conductive coating 1124b thereon, e.g., preferably of indium tin oxide (ITO) or poly-ethylene-dioxythiophene (PDOT) or other conductor that may be made thin enough to be substantially transparent. ITO layers 1122a and 1124b, and optically active layer 1128 are preferably continuous and extend substantially the length of substrates 1122a, 1122b. Insulating yarn 1130 includes an insulating substrate, e.g., of polyester, and may be woven in the warp, in the weft, or in both.

Conductive yarns 1120a and 1120b are preferably long, thin strips of rectangular cross-section, as shown in FIG. 10B, but my be of circular, oval, elliptical or other desired cross-section. A non-flat LC yarn 1120a, 1120b may include an electrically-conductive core having an optically active LC layer thereon and an ITO, PDOT or other transparent conductive layer overlying the optically active layer 1128. In addition and optionally, a layer of an insulating material may be coated or otherwise deposited over conductive layers 1124a, 1124b, to insulate them against electrical shorting. Optically active material 1128 may serve as the insulating coating of yarn 1120b. Optionally, the insulating layer may extend over the edges and/or the back surfaces of yarn 120a, 1120b.

At each location where a conductive yarn 1120a crosses a conductive yarn 1120b in article 1000, an optically active or other electronic element 1170 is defined having dimensions that are substantially the width of each yarn 1120a, 1120b. Thus, if each yarn 1120a, 1120b is 1 mm wide, each optically active element or optical cell 1170 is about 1 mm by 1 mm. Specifically, element 1170 is typically a liquid crystal element or cell including a "stack" of conductor layer 1124b providing an electrode, LC material 1128 and conductor layer 1124a providing a second electrode. Thus, because conductors 1124a and 1124b of yarn 1120a, 1120b are close together, e.g., yarn 1120a and 1120b typically touch, applying a relatively low electrical potential between conductors (electrodes) 1124a and 1124b generates a relatively high electric field that causes the optical characteristic of LC material 1128 therebetween to be in a particular defined state.

Because ITO layers 1124a and 1124b, and LC layer 1128 are preferably continuous and extend substantially the length of substrates 1122a, 1122b, or at least a segment of the length thereof, relative movement of yarn 1120a and 1120b at any crossing(s) thereof does not affect that an LC element 1170 is defined thereat, thereby avoiding electrical connection by mechanical attachment that would reduce the flexibility of the fabric 1000. Each element 1170 provides, e.g., one pixel of a display. A display for images may include, e.g., 200,000 to 2,000,000 pixels whereas text may be displayed in character blocks of 35 to 144 pixels.

One suitable LC material is a polymer dispersed liquid crystal (PDLC), such as dispersed cholesteric LC, which can be coated on and polymerized in place on ITO layer 1124a of substrate 1122a, and can be turned on and off (switched) by field coupling, so that electrical contact at the crossing of conductive yarn 1120a, 1120b is not necessary. In addition, the optical characteristics thereof can be adjusted to reflect colors and/or wavelengths in the visible and/or infrared spectra, e.g., by adjusting dispersion size and/or dyes. An advantage of PDLC material is that is a solid polymer material. PDLC may include a dispersion of semetic A phase liquid crystal material or a cholesteric liquid crystal material that makes it a bistable material which requires little electrical power to switch optical state and no electrical power to maintain an optical state. Alternative optical materials to the PDLC material include, for example, electro-luminescent (EL) materials, organic light emitting devices (OLED) materials, electrophoretic materials, light emitting diodes (LEDs), and the like. Polarizing layers, reflective layers, color and other filter layers, protective and/or encapsulating layers, and the like may be utilized on yarn 1120, 1130 as needed and desired. In addition, the polarizing and/or coloring material may be included in the material of substrate 1122a, 1122b, if desired.

Figure 10C:
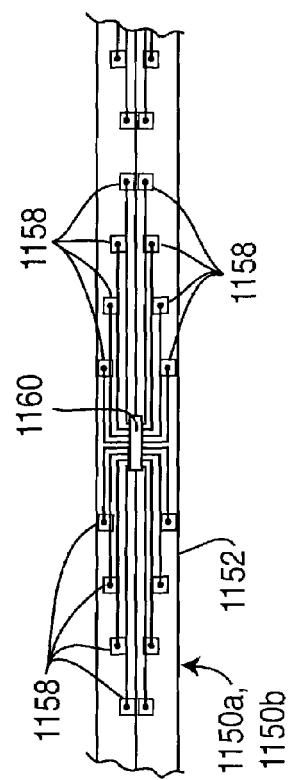
FIG. 10C is a plan view schematic diagram of a functional yarn thereof.

Conductive yarn 1120a, 1120b by may be made by a process similar to that described above in relation to functional yarn, e.g., by coating a thin sheet of polyester substrate material 1122 with a layer 1124 of ITO, and for yarn 1120a coating a layer 1128 of PDLC or other optically active material on ITO layer 1124, and then slitting or otherwise cutting the sheet 1122 into long narrow strips as illustrated in FIGS. 10A-10C. Typically, ITO conductive yarn 1120b may be woven in the warp and LC-ITO conductive yarn 1120a in the weft. Where appropriate, optically active layer 1128 and ITO layers 1124a, 1124b, may be scribed or cut to isolate adjacent blocks, as where optical elements 1170 of article 1000 are addressed in blocks. In addition, any of the conductive yarn and/or insulating yarn described above may be woven into the warp and/or weft of article 1000 as may be desired for spacing, density and/or providing electrical conductors and/or connections.

FIG. 10C is a plan view schematic diagram of a portion of a functional yarn 1150a, 1150b of the woven article 1000 of FIGS. 10A and 10B. While only one functional yarn 1150a, 1150b is illustrated in each of the warp and the weft, it is understood that any desired number of functional yarn may be dispersed among the yarn 1120a, 1120b, 1130 in the warp and/or in the weft, and may be at or near an edge of article 1000 and/or anywhere between the edges thereof. It is also noted that functional yarn 1150a, 1150b distribute an electronic circuit including electronic devices 1160 and various conductors throughout the article 1000, rather than on a circuit board that is connected to the article, e.g., at the ends of various yarn thereof.

Each functional yarn 1150a, 1150b includes one or more electronic devices 1160a, 1160b, respectively, on an insulating substrate 1152. Insulating substrate 1152 of functional yarn 1150a, 1150b is typically long, narrow and thin, such as a strip of polyester or polyimide, and has a pattern of electrical conductors thereon defining mounting locations, and providing one or more of power, ground and/or signal connections, for devices 1160a, 1160b and contacts 1158. While functional yarn 1150a, 1150b are similar, they need not be identical in size, conductor pattern, contact 1158 pattern and/or electronic device 1160.

The pattern of conductors may include one or more conductors that extend along the length of substrate 1152 for connecting with other devices 1160a, 1160b thereon and/or to sources of power and signal, whether external or included in woven article 1000. The conductor pattern defines contacts 1158 at locations on functional yarn 150a and 1150b where conductive yarn 1120b and 1120a, respectively, cross therewith for electrically connecting outputs of driver devices 1160a and 1160b to the electrodes 1124b of conductive yarn 1120b and electrodes 1124a of conductive yarn 1120a, respectively. Thus, contacts 1158 are spaced along yarn 1150a, 1150b at the pitch of conductive yarn 1120a, 1120b in textile or fabric 1000, and may be electrically connected to electrodes 1124b and 1124a thereof by a solder or an electrically conductive adhesive connection.

Functional yarn 1150a, 1115b may be made by the process described above wherein plural pieces of functional yarn are made on a sheet that is then separated into individual functional yarn 1150a, 1150b. Electronic devices 1160a, 1160b are typically integrated circuit (IC) driver devices and/or controller/driver devices for the LC elements 1170 and are attached before the sheet is separated into individual functional yarn 1150a, 1150b. Electronic devices 1160a, 1160b are disposed on one of the opposing surfaces of substrate 1152 and the pattern of electrical conductors and contacts 1158 are disposed on one or both of the opposing surfaces thereof. For matrix addressing of LC elements 1170, devices 1160a, 1160b may be a column driver/controller and a row driver/controller, respectively. Connections to article 1000 may be made at one or more edges thereof and/or via electrical connections to the back side thereof.

Article 1000 may be a display device, sign, camouflage blanket or cover, and the like, in the visible and/or infra-red regions of the electromagnetic spectrum, and may be of any desired size that can be woven. Elements 1170 thereof may be driven by any of the passive and/or active matrix and/or addressing arrangements described above, however, where article 1000 is large, it is preferred that sections thereof be defined as "blocks" and that each block be addressed (e.g., driven and/or activated) independently. For example, a block of about 100 yarn 1120a by about 100 yarn 1120b may be defined as an addressed block, and the blocks of the article 1000 may be addressed in matrix fashion. This block addressing approach is thought to avoid the large numbers of active electronic devices and connections that would be required to address a large article 1000 using active matrix addressing of individual pixels (e.g., elements 1170) and to avoid the large scan times and high data rates that may be required for passively addressing many rows (e.g., yarn 1120a or 1120b).

In block addressing, a particular pair of functional yarn 1150a, 1150b cooperate to activate the optically-active elements (pixels) to assume desired optical states, thereby to define an optical pattern. The optical pattern of each block may represent, e.g., an image or a portion of an image, or may display one or more characters of a message. With the bistable optically-active materials such as PDLC, once the block of pixels is addressed and set to desired states, no further addressing is necessary until it is desired to change the states of pixel(s) thereof. As a result, an article 1000 of very large size having the optically-active elements 1170 thereof defined into blocks may be addressed one or more blocks at a time until the entire article 1000 has been addressed. An advantage thereof is that the length of conductors between devices 1160 and contacts 1158 of functional yarn 1150a, 1150b, may be relatively short even though yarn 1150a, 1150b, may be quite long.

Where it is desired to address all of the blocks at substantially the same time, or to address the blocks as groups of blocks, so that an image could be written onto the display of article 1000 more quickly than with one-block-at-a-time addressing, the conductors 1124a of yarn 1120a and/or conductors 1124b of yarn 1120b include electrical discontinuities at the boundaries between adjacent addressing blocks. While the entire article 1000 may include rows and columns of addressed blocks, only rows or columns of address blocks may be provided, e.g., only the conductor 1124a or the conductor 1124b includes electrical discontinuities. With quicker block addressing, images that change at a faster rate, such as video images, may be displayed. Functional yarn 1150a, 1150b may be included in the warp, in the weft, or in both the warp and the weft.

Electrical discontinuity may be provided by patterning the conductor 1124a, 1124b when making yarn 1120a, 1120b, or thereafter by scribing or cutting conductor 1124a, 1124b at the appropriate location(s). Alternatively, such discontinuity may be provided by weaving address-block-length sections of yarn 120a and 1120b or by cutting yarn 120a, 1120b at the boundaries of the blocks, however, in this case it is desirable to adhesively attach the cut ends of yarn 120a, 1120b to contacts 1158 of functional yarn 1150a, 1150b. Further, the process by which connections are made to contacts 1158 could disrupt the continuity of conductor 1124a, 1124b at that location.

Article 1000 may be viewed from either side, i.e. from the front and/or the back surface, where the materials forming substrates 1122a, 1122b, conductors 1124a, 1124b and optically active material 1128 are transparent. If conductor 1124a of yarn 1120a or conductor 1124b of yarn 1120b is not transparent, article 1000 would be viewable from only one side, as may be appropriate and/or desirable, e.g., where article 1000 is a display or sign. In such case, conductor 1124a or 1124b could be aluminum, copper, silver, gold, or other metal.

It is noted that insulating yarn 1130 in the warp and/or the weft is not optically active and so reduces the fraction of the total surface area of article 1000 that is optically active, e.g., LC elements 1170. It is usually desirable that the width of insulating yarn 1130 be substantially less, and typically much less, than the widths of yarn 120a and 1120b. Thus, a thin circular insulating yarn 1130 is satisfactory. Another way to increase the fraction of the area of the optically active elements 1170 is to provide for an optically active element 1170 to be formed at every crossing of a yarn 1120a and a yarn 1120b. To this end, a conductor layer 1124a and an optically active layer 1128 may be provided on both of the opposing surfaces of substrate 1122a of yarn 1120a and/or a conductor layer 1124b may be provided on both of the opposing surfaces of substrate 1122b of yarn 1120b.

Because the electrodes 1124a, 1124b and optically active material 1128 are preferably in the space between substrates 1122a and 1122b of yarn 1120a and 1120b, optically active elements 1170 are viewed through one of the substrates 1122a, 1122b. By coloring yarn 1120a or 1120b, a colored display is provided. For a full color display, the substrates 1122a of yarn 1120a or the substrates 1122b of yarn 120b are colored and dispersed in article 1000 in a repeating sequence, e.g., a red-green-blue sequence. Yarn 1120a, 1120b may be colored by tinting, dyeing or coating the substrate 1122a, 1122b thereof and/or by applying a layer of an appropriately colored material thereon.

Woven textiles including electronic function as described herein are suitable for many different applications and/or articles having utility for consumer, private, public, professional, commercial, government, military and other entities. Among such are, for example, programmable alpha-numeric signage as for traffic warning, advertising, window signs, banners, portable signs, garments and articles of clothing (e.g., for people and/or animals), safety-wear bibs, vests and other safety garments, footwear, articles and/or garments for a baby and/or an infant, personal flotation devices, life saving apparatus, blankets, medical devices, light blankets, warming blankets, sensing blankets, apparatus and/or equipment for sport, sports wear, uniforms, toys, entertainment devices, truck and other vehicle signage, construction and/or work area signs, directional signs, lighting, emergency lighting, lighting panels, decorative lights, accent lights, reading lights, lighting for a tent, tarp, canvas and/or umbrella, display lighting, sensor fabrics, environmental and/or chemical and/or biological agent sensor arrays, camouflage, a parachute, a uniform (e.g., for government, military, sport and/or medical personnel), light sensing arrays, imaging arrays, and any other article including a woven fabric.

In each application, because the article is a woven fabric article it has the give and drape characteristics of fabric, and so can be hung, draped, folded, rolled or otherwise placed in a non-planar condition. Thus, even very large articles can be folded, rolled up or otherwise stored in a small space. For example, a 2 by 3 meter sign could easily be folded and/or rolled up and placed in the trunk or other storage compartment of a vehicle such as a police, fire, ambulance or other emergency vehicle and/or the storage space of a truck or automobile. In addition, a lightweight pop-up support frame, similar to the support frames employed with a camping tent, may be employed with a textile article as described herein. When unfolded, woven fabric articles may be draped or otherwise placed to conform to a desired surface and/or shape.

The yarn utilized in weaving the fabric may be made wider consistent with the size of the woven sign and the resolution and/or pixel or display element size desired and/or the capability of the loom (either an automated or a manual loom) to weave wide yarn. For example, standard modern looms can weave yarn up to about 10 mm wide. A large display and/or sign, such as a banner scoreboard, may be 10 meter long and 1 meter wide, and may, e.g., be woven of yarn and functional yarn strips having a width of about 2-3 cm. Because the message presented by such large signs and banners is easily changed, one sign or banner can be reused many times for many different purposes, the cost is lower than if a different printed sign is utilized for each event, and illumination is not needed for use during darkness. Signs and banners may be rolled, e.g., on a window-shade-type roller for convenient and quick set up and removal, or may simply be folded.

While the present invention has been described in terms of the foregoing exemplary embodiments, variations within the scope and spirit of the present invention as defined by the claims following will be apparent to those skilled in the art. For example, electrical connection to contacts and/or conductors of functional yarn may be made directly to the functional yarn at an edge of the fabric or may be made via crossing conductive yarn to which connections are made at an edge of the fabric, or a combination of connection arrangements may be utilized.

In addition, functional yarn could include an electrically conductive substrate on which are placed electronic devices and contacts therefor, wherein an insulating layer and/or a pattern of insulating areas are disposed on the conductive substrate to provide insulation for such contacts. Further, placement and registration of functional yarn in a fabric may be to align the electronic devices thereon, or registration of the functional yarn may be to place such devices in a pattern other than an aligned pattern, as might be desirable for an electronically functional fabric utilized for camouflage.

While sufficient electrical connection between conductive yarn and/or functional yarn is typically made at locations where such yarn cross in a fabric, other conductive adhesive such as ultraviolet-cured adhesive may optionally be employed to improve such connection.

As stated herein, examples of a fabric, textile and/or article having a particular yarn in one of the warp and weft is intended to describe the fabric, textile and/or article with such yarn in the warp, in the weft, or in the warp and in the weft.

Any weave may be employed, including but not limited to, plain or tabby, twill, overshot, laid-in, leno, gauze, loop, combinations thereof, and any other weave.

The terms electrical device, electronic device, electrical component and electrical component are used interchangeably herein, and any one is intended to include any or all of the others. The same is true as to the terms conductor, contact and terminal, e.g., in the context of a functional yarn and/or electronic device, and the terms "electrical" and "electronic." Similarly, "optical" devices include, for example, devices that detect and/or produce electromagnetic radiation, and/or that otherwise operate, in the visible, infrared, ultra-violet, x-ray and/or other regions of the electromagnetic spectrum, including a narrow band thereof such as would define a "color."

What is claimed is:

1. A woven article having an electronic function interwoven therein, comprising:
    at least one electrically conductive yarn disposed in one of a warp or a weft direction of said woven article, said electrically conductive yarn being suitable for transmitting an electrical current; and
    at least one functional yarn disposed in one of said warp or said weft direction of said woven article and crossing said electrically conductive yarn, said functional yarn comprising:
        a flexible elongated insulating electronic substrate;
        at least two electrical conductors disposed substantially overlying and extending lengthwise along at least a portion of at least one surface of said flexible elongated insulating electronic substrate, said at least two electrical conductors being suitable for transmitting an electrical current, said at least two electrical conductors being strategically positioned to underlie said electrically conductive yarn at their crossing, the at least two electrical conductors being coated with an insulating coating, except at locations where electrical connections are to be made; and
        a plurality of electronic devices disposed on and mechanically affixed to said flexible elongated insulating electronic substrate and electrically connected to at least one of said two electrical conductors, said plurality of electronic devices receiving said electrical current transmitted by at least one of said at least two electrical conductors on the functional yarn and said at least one electrically conductive yarn crossing said functional yarn.

2. The woven article of claim 1 wherein said at least one electrically conductive yarn and at least one of said at least two electrical conductors of said functional yarn electrically connect at one or more of:
    an exposed portion of at least one of said at least two electrical conductors;
    an exposed portion of at least one of said at least two electrical conductors proximate an end of said elongated insulating electronic substrate;
    a contact in electrical connection with at least one of said at least two electrical conductors; and/or
    a contact proximate an end of said elongated insulating electronic substrate and electrically connected with at least one of said at least two electrical conductors.

3. The woven article of claim 1 wherein said at least one electrically conductive yarn and at least one of said at least two electrical conductors of said at least one non-conductive functional yarn are in electrical contact at a location where said at least one electrically conductive yarn crosses said at least one functional yarn in said woven article without a mechanical attaching thereof at said location.

4. The woven article of claim 1:
wherein said at least two electrical conductors includes a signal and/or data conductor; and wherein said at least one of said plurality of lumped electronic devices is addressable via said signal and/or data conductor for controlling and/or activating at least a second electronic device; and/or
wherein said at least one of said plurality of lumped electronic devices is addressable by passive matrix addressing, active matrix addressing, serial addressing, parallel addressing, scanned addressing, active addressing, block addressing, and/or individual addressing.

5. The woven article of claim 1 wherein said at least one of said plurality of lumped electronic devices includes one or more of a temperature sensor, a chemical sensor, a biological sensor, a sensor of force, pressure, sound, an electric field, a magnetic field, light, acceleration and/or an environmental condition, a source of tight, force, heat, electromagnetic radiation and/or sound, an infra red and/or wireless transmitter and/or receiver, an imager, a CCD imager, a thermoelectric sensor, cooler, heater and/or generator, a liquid crystal element, an electro-luminescent element, an organic light-emitting element, an OLED, an electrophoretic element, an LED, a piezo-electric element and/or transducer, a microphone, a loudspeaker, an acoustic transducer, a resistor, a processor, a digital signal processor, a microprocessor, a micro-controller, a CPU, an analog-to-digital converter, a digital-to-analog converter, a data-producing device, a data-utilizing device, a processing device, a switch, a human-interface device, a human-input device, a blinker and/or flasher, a battery, a solar cell, a photovoltaic device, a power source, and/or an addressable device.

6. The woven article of claim 1 embodied in a fabric, a textile, a consumer article, a professional article, a commercial article, a government article, a military article, programmable alpha-numeric signage, a traffic warning sign, an advertising sign, a window sign, a banner, a portable sign, a garment, an article of clothing, an article and/or garment for a baby and/or an infant, a safety-wear bib, a vest, a safety garment, a personal flotation device, life saving apparatus, footwear, a blanket, a medical device, a light blanket, a warming blanket, a sensing blanket, apparatus and/or equipment for sport, sports wear, a uniform, a toy, an entertainment device, truck signage, vehicle signage, a construction and/or work area sign, a directional sign, lighting, emergency lighting, a lighting panel, a decorative light, an accent light, a reading light, lighting for a tent, tarp, canvas and/or umbrella, display lighting, a sensor fabric, an environmental and/or chemical and/or biological agent sensor array, camouflage, a parachute, a light sensing array, and/or an imaging array.

7. A woven article having a warp and a weft comprising:
a plurality of electrically insulating and/or electrically conductive yarn in said warp;
a plurality of electrically insulating and/or electrically conductive yarn in said weft interwoven with said plurality of electrically insulating and/or electrically conductive yarn in said warp; and
at least one functional yarn woven in one of said warp and said weft adjacent an electrically insulating yarn thereof and crossing at least one electrically conductive yarn, said functional yarn comprising:
a flexible elongated insulating electronic substrate;
at least two electrical conductors disposed substantially overlying and extending lengthwise along at least a portion of at least one surface of said flexible elongated insulating electronic substrate, said electrical conductors being strategically positioned to underlie said at least one electrically conductive yarn at their crossing, the at least two electrical conductors being coated with an insulating coating, except at locations where electrical connections are to be made; and
a plurality of electronic devices disposed on and mechanically affixed to said flexible elongated insulating electronic substrate and electrically connected to at least one of said at least two electrical conductors, said plurality of electronic devices receiving an electrical current transmitted by said at least one of said at least two electrical conductors on the functional yarn and said at least one electrically conductive yarn.

8. The woven article of claim 7 wherein one of said at least two electrical conductors of said at least one functional yarn is in electrical contact with an electrically conductive yarn at a location where said at least one functional yarn crosses said electrically conductive yarn in said woven article without a mechanical attaching of said at least one functional yarn and said electrically conductive yarn at said location.

9. The woven article of claim 7 wherein said at least one electrically conductive yarn and at least one of said at least two electrical conductors of said functional yarn electrically connect at one or more of:
an exposed portion of at least one of said at least two electrical conductors;
an exposed portion of at least one of said at least two electrical conductors proximate an end of said elongated insulating electronic substrate;
a contact in electrical connection with at least one of said at least two electrical conductors; and/or
a contact proximate an end of said elongated insulating electronic substrate and electrically connected with at least one of said at least two electrical conductors.

10. The woven article of claim 7:
wherein at least one of said at least two electrical conductors includes a signal and/or data conductor, and wherein said at least one electronic device is addressable via said signal and/or data conductor for controlling and/or activating at least a second electronic device; and/or
wherein said at least one of said plurality of lumped electronic devices is addressable by passive matrix addressing, active matrix addressing, serial addressing, parallel addressing, scanned addressing, active addressing, block addressing, and/or individual addressing.

11. The woven article of claim 7 wherein said at least one of said plurality of lumped electronic devices includes one or more of a temperature sensor, a chemical sensor, a biological sensor, a sensor of force, pressure, sound, an electric field, a magnetic field, light, acceleration and/or an environmental condition, a source of light, force, heat, electromagnetic radiation and/or sound, an infra red and/or wireless transmitter and/or receiver, an imager, a CCD imager, a thermoelectric sensor, cooler, heater and/or generator, a liquid crystal element, an electro-luminescent element, an organic light-emitting element, an OLED, an electrophoretic element, an LED, a piezo-electric element and/or transducer, a microphone, a loudspeaker, an acoustic transducer, a resistor, a processor, a digital signal processor, a microprocessor, a micro-controller, a CPU, an analog-to-digital converter, a digital-to-analog converter, a data-producing device, a data-utilizing device, a processing device, a switch, a human-interface device, a human-input device, a blinker and/or flasher, a battery, a solar cell, a photovoltaic device, a power source, and/or an addressable device.

12. The woven article of claim 7 embodied in a fabric, a textile, a consumer article, a professional article, a commercial article, a government article, a military article, programmable alpha-numeric signage, a traffic warning sign, an advertising sign, a window sign, a banner, a portable sign, a garment, an article of clothing, an article and/or garment for a baby and/or an infant, a safety-wear bib, a vest, a safety garment, a personal flotation device, life saving apparatus, footwear, a blanket, a medical device, a light blanket, a warming blanket, a sensing blanket, apparatus and/or equipment for sport, sports wear, a uniform, a toy, an entertainment device, truck signage, vehicle signage, a construction and/or work area sign, a directional sign, lighting, emergency lighting, a lighting panel, a decorative light, an accent light, a reading light, lighting for a tarp, canvas and/or umbrella, display lighting, a sensor fabric, an environmental and/or chemical and/or biological agent sensor array, camouflage, a parachute, a light sensing array, and/or an imaging array.

* * * * *